US006468845B1

(12) United States Patent
Nakajima et al.

(10) Patent No.: US 6,468,845 B1
(45) Date of Patent: Oct. 22, 2002

(54) SEMICONDUCTOR APPARATUS HAVING CONDUCTIVE THIN FILMS AND MANUFACTURING APPARATUS THEREFOR

(75) Inventors: Takashi Nakajima, Ibaraki-ken; Hideo Miura, Koshigaya; Hiroyuki Ohta; Noriaki Okamoto, both of Ibaraki-ken, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/536,642

(22) Filed: Mar. 28, 2000

Related U.S. Application Data

(60) Continuation of application No. 08/985,179, filed on Dec. 4, 1997, now Pat. No. 6,043,142, which is a division of application No. 08/749,324, filed on Nov. 14, 1996, which is a division of application No. 08/534,118, filed on Sep. 26, 1995, now Pat. No. 5,683,515, which is a division of application No. 08/432,065, filed on May 1, 1995, now abandoned, which is a division of application No. 08/168,506, filed on Dec. 22, 1993, now Pat. No. 5,444,302.

(30) Foreign Application Priority Data

Dec. 25, 1992 (JP) .......................................... 04-358065

(51) Int. Cl.$^7$ .............................................. H01L 21/84

(52) U.S. Cl. ..................................................... 438/166

(58) Field of Search ............................... 438/151, 166, 438/479, 585

(56) References Cited

U.S. PATENT DOCUMENTS

| 4,249,968 A | 2/1981 | Gardiner et al. |
| 4,319,954 A | 3/1982 | White et al. ................ 437/233 |
| 4,354,309 A | 10/1982 | Gardiner et al. ......... 257/412 X |
| 4,358,326 A | 11/1982 | Doo ........................... 437/233 |

(List continued on next page.)

FOREIGN PATENT DOCUMENTS

| EP | 0326218 | 8/1989 |
| JP | 56135472 | 10/1981 |
| JP | 58061641 | 4/1983 |

(List continued on next page.)

OTHER PUBLICATIONS

Wu, et al., "High–Performance Polysilicon Contacted Shallow Junctions Formed by Stacked–Amorphous–Silicon Films", IEEE Electron Device Letters, vol. 13, No. 1, pp. 23–25, 1–92.

Primary Examiner—John F. Niebling
Assistant Examiner—Stacy Whitmore
(74) Attorney, Agent, or Firm—Antonelli, Terry, Stout & Kraus, LLP

(57) ABSTRACT

In forming an electrode 2 on a silicon oxide film 5 on a semiconductor substrate 4 through a silicon oxide film 5, for example, the gate electrode 2 is structured in a laminated structure of a plurality of polycrystalline silicon layers 6. The portion of the gate electrode 2 is formed by a method of manufacturing a thin film having a process of depositing amorphous layers and a process of crystallizing (recrystallizing) this amorphous material. In this case, depositing of the amorphous layers is carried out dividedly by a plurality of times so that the thickness of an amorphous layer to be deposited at one time is not larger than a thickness to be prescribed by a critical stress value determined according to a fail event, the amorphous material is crystallized after each process of depositing each amorphous layer has been finished, and the process of depositing amorphous layers and the process of crystallizing the amorphous material are repeated, whereby a laminated structure of the polycrystalline layer 6 having a necessary film thickness is obtained. With the above-described arrangement, it is possible to prevent a deterioration of electric characteristics of a semiconductor device and an occurrence of a defect, such as a peeling off between layers, cracks in a layer, etc., and it is possible to obtain a polycrystalline layer of small grain size in a desired film thickness by a lamination of polycrystalline materials.

35 Claims, 29 Drawing Sheets

U.S. PATENT DOCUMENTS

| | | | |
|---|---|---|---|
| 4,415,383 A | 11/1983 | Naem et al. ................. | 437/233 |
| 4,742,020 A | 5/1988 | Roy ............................. | 437/233 |
| 4,777,150 A | 10/1988 | Deneuville et al. .......... | 437/200 |
| 4,810,637 A * | 3/1989 | Szdlo et al. .................. | 438/30 |
| 4,870,031 A | 9/1989 | Sugahara et al. ........... | 437/173 |
| 4,873,204 A | 10/1989 | Wong et al. ................. | 437/193 |
| 4,897,150 A | 1/1990 | Dooley et al. ............... | 437/233 |
| 4,971,919 A | 11/1990 | Yamazaki .................... | 437/193 |
| 4,985,371 A | 1/1991 | Rana et al. .................. | 437/193 |
| 5,037,774 A | 8/1991 | Yamawaki et .............. | 437/247 |
| 5,147,820 A | 9/1992 | Chittipeddi et al. ......... | 437/193 |
| 5,155,051 A | 10/1992 | Noguchi et al. ............. | 437/233 |
| 5,177,569 A | 1/1993 | Koyama et al. ............. | 257/412 |
| 5,254,208 A * | 10/1993 | Zhang ......................... | 438/479 |
| 5,256,894 A | 10/1993 | Shino .......................... | 257/388 |
| 5,298,436 A * | 3/1994 | Radosevich ................. | 438/396 |
| 5,306,651 A | 4/1994 | Masumo et al. ............ | 437/173 |
| 5,354,700 A * | 10/1994 | Huang et al. ............... | 438/151 |
| 5,381,032 A | 1/1995 | Kokawa et al. .............. | 257/412 |
| 5,389,580 A * | 2/1995 | Miyasaka .................... | 438/479 |
| 5,481,128 A | 1/1996 | Hong ......................... | 257/64 X |
| 5,683,515 A * | 11/1997 | Nakajima et al. ............ | 118/115 |
| 5,720,074 A | 2/1998 | Ohshimo ..................... | 437/193 |
| 5,913,125 A * | 6/1999 | Brouillette ................... | 438/386 |
| 6,043,142 A * | 3/2000 | Nakajima .................... | 438/585 |
| 6,118,140 A * | 9/2000 | Nakajima et al. ............ | 257/64 |

FOREIGN PATENT DOCUMENTS

| | | | |
|---|---|---|---|
| JP | 62014414 | 1/1987 | |
| JP | 02084728 | 3/1990 | |
| JP | 2298074 | 12/1990 | ................. 257/412 |
| JP | 9110182 | 7/1991 | |
| JP | 04127482 | 4/1992 | |
| JP | 4142081 | 4/1992 | |
| JP | 4154170 | 5/1992 | ................. 257/412 |

* cited by examiner 100 nm

SEMICONDUCTOR APPARATUS HAVING CONDUCTIVE THIN FILMS AND MANUFACTURING APPARATUS THEREFOR

This is a Continuation application of application Ser. No. 08/985,179, filed Dec. 4, 1997 now U.S. Pat. No. 6,043,142, which is a Divisional application of application Ser. No. 08/749,324, filed Nov. 14, 1996, which is a Divisional application of application Ser. No. 08/534,118, filed Sep. 26, 1995 now U.S. Pat. No. 5,683,515, which is a Divisional application of application Ser. No. 08/432,065, filed May 1, 1995 abandoned, which is a Divisional application of application Ser. No. 08/168,506, filed Dec. 22, 1993 now U.S. Pat. No. 5,444,302.

BACKGROUND OF THE INVENTION

The present invention relates to a semiconductor device and a manufacturing method therefor, and relates more particularly to a semiconductor device that has a thin-film structure with a lamination of polycrystalline layers divided into layers, each having a thickness not larger than a predetermined thickness prescribed according to a fail event, or a semiconductor device that has a thin-film structure with a lamination of polycrystalline layers and layers of another material, of which a main component thereof is different from the main component of the polycrystalline layers, for separating these polycrystalline layers from each other, a method of manufacturing this device, a manufacturing device therefor, and a method of determining a film thickness of the polycrystalline layers for preventing a fail event of the semiconductor device.

In recent years, amorphous materials have been used widely for various applications, such as for semiconductor device materials and magnetic materials, by taking advantage of such characteristics as isotropy and uniformity that can be obtained from the amorphous materials. As a material for a semiconductor device, amorphous silicon has been widely used for the purpose of easily obtaining a uniform density of an impurity.

When a silicon thin-film has been formed as a polycrystalline silicon layer on the surface of a semiconductor substrate, stress generated within the film is sufficiently low so as to be not higher than a few hundred MPa. After an amorphous film layer has been formed on the surface of the semiconductor substrate, when the amorphous film is exposed to a high temperature higher than the temperature at which a previously-coated amorphous material is crystallized for forming another film made of other material on the film, or for carrying out a heat processing to relax a stress caused by the other layer, or for crystallizing the amorphous material of the film formed, the volume of the film shrinks as the crystallization of the amorphous material progresses, with a result that, in some cases, an extremely large tensile stress reaching 1000 MPa is generated within the film.

Because of failures (such as warp deformation in the wafer, peeling-off between layers, cracks within a layer, etc.) generated within the semiconductor device due to the occurrence of this tensile stress, there has been a case that the reliability of the product was deteriorated seriously. In order to prevent an occurrence of such a defect as described above, a method has been taken that a film having a compressive stress generated within the film or a film having a tensile stress generated within the film is laminated to reduce the total stress, for example, as described in the Japanese Patent Unexamined Publication No. JP-A-63-260052.

In relation to the formation of a laminated layer of polycrystalline silicon films in the semiconductor device, there are also other techniques such as described in the Japanese Patent Unexamined Publication No. JP-A-63-29954 and the Japanese Patent Unexamined Publication No. JP-A-3-3326. These techniques provide the techniques for laminating materials of mutually different substances.

However, when an amorphous film is formed on the surface of the semiconductor substrate and the film layer is crystallized to have a polycrystalline layer, the newly grown grain becomes larger as the film thickness is larger and there is a tendency that the proportion of the volume contraction becomes larger. As a result, depending on the thickness of the film formed, the tensile stress generated in the amorphous material layer that has been crystallized becomes larger than the bonding strength between the film layers formed or the strength of the materials of the film layers formed, which may result in a failure such as a peeling off between layers or a crack within a layer.

Further, even if the above-described failure has not occurred in the semiconductor device, a film thickness has become a cause for generating a warp deformation in the wafer which may cause a fault at the time of an exposure, or an increase in the dislocation density following an increase in the strain at a film interface of the amorphous material has caused a deterioration in the electric characteristics within the semiconductor device such as an increase in the electric conductivity or inter-connection. Thus, it has been necessary to provide a limit to a film thickness at the time of forming films in order to control a stress within a film.

In the specification of the present invention, various defects induced by an increase in the stress generated within the semiconductor device will collectively be referred to as "a fail event of the semiconductor device". An allowable stress level at which none of these fail events will occur may change widely depending on a difference in the process of manufacturing a semiconductor device, a difference in portions of a laminated film which are used for a semiconductor device, physical properties of materials used and a corresponding fail event. Therefore, an allowable stress value at which a fail event of the semiconductor device will not occur will be called "a critical stress value".

When a thickness of a polycrystalline phase film which has been obtained by crystallizing an amorphous phase film is small, the crystal grains become fine and a stress generated is lowered and no defect, described in the forgoing, will occur. However, the thin film thickness has limited an allowable current that can flow within the film and also has become a cause for a defect such as an electromigration that is generated by an excess current within the film. Thus, it has been difficult to form a film with an optimum film thickness by using a polycrystalline phase film which was produced by crystallizing an amorphous material layer.

SUMMARY OF THE INVENTION

Objects of the present invention are as follows.

(1) In a thin-film manufacturing method having a process of depositing amorphous layers and a process of crystallizing the amorphous materials, it is an object of the present invention to provide a method of manufacturing a semiconductor device which can form a film thickness of a required design specification for a thin-film structure made of the conductive material that includes an amorphous layer to be crystallized in a later process, and which can eliminate defects, such as a deterioration of electric characteristics of the semiconductor device manufactured, peeling-off between layers, cracks within a layer, etc.

(2) It is an object of the present invention to provide a semiconductor device of a high reliability which can prevent an occurrence of a defect by the method of manufacturing a semiconductor device that is provided in (1).

(3) In a thin-film manufacturing device which can carry out a process of depositing amorphous layers and a process of crystallizing the amorphous materials, it is an object of the present invention to provide a device for manufacturing a thin-film which can automatically control the process of forming an amorphous layer and the process of crystallizing the amorphous material, in an integrated process without exposing the thin film in manufacturing to the atmosphere.

(4) In order to achieve the objects (1) to (3) of the present invention, it is an object of the present invention to provide a method of determining a maximum value of a film thickness in which an amorphous layer can be deposited at one time to ensure that an occurrence of a fail event is prevented, not based on experience.

In order to achieve the above-described objects, the present invention has the following characteristics.

A semiconductor device of the present invention has conductive thin films and is characterized by the following. (1) At least a part of the thin-film has a laminated structure divided along a film thickness direction, and each of the divided layers has a main component made of the same element or the same compound. (It is desirable that the main component is a material including silicon atom or metal silicide. The material of each layer may be different from that of the other by doping). (2) At least a part of the thin-film has a laminated structure divided along a film thickness direction, and an average crystal grain size of the grains within each one of the divided layers is about 1/2 times to about ten times of the thickness of the divided layer. (For example, the grain size is equal to the thickness of the divided film or is in the same order or is about a fraction or several times as the divided film thickness.) (3) Additionally, or alternately, at least a part of the thin-film has a laminated structure divided along a film thickness direction, and the thickness of each layer is not larger than a thickness prescribed by a critical stress value that is determined according to a fail event of the semiconductor device.

In either case, a semiconductor device is the one having a thin-film structure made of the same conductive material and it is desirable that the thin-film is divided, at least once, along its film thickness direction. It is also desirable that the thin film consists of at least two polycrystalline layers and the thin film is applied to a portion selected from a group of electrodes (preferably a gate electrode) and wiring layers. It is also effective to have another layer made of a material different from that of the polycrystalline layer, at a position for separating the polycrystalline layer into layers. It is also effective to have different densities of impurity in adjacent layers of at least one pair of adjacent layers of the thin film divided along the film thickness direction.

The semiconductor device of the present invention is also characterized in that a trench or a rugged surface is provided on the surface of the semiconductor substrate, that a conductive multi-layer thin film is formed on a part or a whole of the trench or the rugged surface of the surface of the semiconductor substrate so as to cover a portion of a corner formed by at least the semiconductor substrate surface, the trench and the rugged surface, and that each layer has a main component which is the same element or the same compound. In this case, it is desirable that the conductive multilayer thin film is polycrystalline and the thickness of each layer structuring the thin film is not larger than the thickness prescribed by a critical stress level to be determined according to a fail event of the semiconductor device. It is also effective to have a layer made of a material different from that of the polycrystalline layers, at a position for separating adjacent ones of the the polycrystalline layers. It is also effective to have different densities of impurity at least between a pair of adjacent layers of the thin film divided in the film thickness direction.

The semiconductor device of the present invention is also characterized in that it has a laminated layer structure of a metal silicide thin film divided along a film thickness direction by at least one time.

Implementation status of the semiconductor device according to the present invention is as follows.

(1) The semiconductor has a polycrystalline layer obtained from the process of depositing an amorphous layer and a process of crystallizing the amorphous material and there are at least two continuous deposited layers of polycrystalline material whose main component is made of the same material. (2) Each of the laminated polycrystalline layers has a thickness not larger than a thickness prescribed by a critical stress level determined according to a fail event of the semiconductor device. (3) In a semiconductor device having a gate electrode, there are at least two continuous deposited layers of polycrystalline material whose main component is the same material in the whole or part of the gate electrode structure on the semiconductor substrate.

The method of manufacturing a semiconductor device according to the present invention includes a process of depositing layers of amorphous materials on the semiconductor substrate and a process of crystallizing the deposited amorphous materials, and is characterized in that either (1) the process of layers of amorphous material is divided into a plurality of times and the crystallization is carried out for each process of depositing each amorphous layer, or (2) the process of depositing amorphous layers is divided into a plurality of times, a material whose main component is different from that of the amorphous material, is deposited to separate an amorphous layer from an adjacent amorphous layer at each process of depositing each amorphous layer and the amorphous material is crystallized at least after finishing all the deposition processes. In the case of (2), it is desirable that the amorphous material is silicon and the main component for separating the amorphous layers which is different from the amorphous material is a metal which generates a silicide reaction.

In either case, it is desirable that the method of manufacturing a semiconductor device according to the present invention includes the process of differentiating, between at least a pair of adjacent layers, the density of impurity therein, or includes the process of crystallizing the amorphous material which is the crystallization process of an amorphous material by a laser irradiation on either the whole surface of the amorphous layer or on only a selective local portion of the amorphous layer.

The deposition method of thin films according to the present invention includes a process of depositing layers of amorphous materials and a process of crystallizing the amorphous materials, and is characterized in one of the following: (1) the process of depositing layers of amorphous materials is divided into a plurality of times and the crystallization process is applied to each amorphous layer, (2) densities of impurity within the plurality of layers of amorphous materials are different between at least an adjacent pair of layers, (3) the process of depositing amorphous layers is divided into a plurality of times, a material whose main component is different from that of the amorphous material is deposited to separate an amorphous layer from an adjacent amorphous layer and the amorphous layers are crystallized at least after finishing all the processes, and (4) the process of crystallizing the amorphous material which is the crystallization process of an amorphous material by a laser irradiation on either the whole surface of the amorphous layer or on only a selective local portion of the amorphous layer.

The method of manufacturing a thin film according to the present invention is a method of obtaining a metal silicide thin film by generating a silicide reaction by laminating a silicon thin film with a metal thin film, and is characterized in that a metal thin film and a silicon thin film are laminated at least two times respectively and that the film thickness of each laminated layer is not thicker than a film thickness prescribed by a fail event and the metal silicide thin film is manufactured by generating a silicide reaction.

In either case, it is desirable that the method of manufacturing a thin film according to the present invention provides a film thickness of each amorphous layer deposited at one time to be not larger than a film thickness prescribed by a critical stress value that is determined according to a fail event.

The device for manufacturing a semiconductor device according to the present invention is a device for carrying out a process of depositing layers of amorphous materials and a process of crystallizing the amorphous material and is characterized in that the manufacturing device has a chamber for installing a semiconductor substrate in it, a tool for supporting the semiconductor substrate, a heating unit for adjusting a temperature inside the chamber and a temperature of the substrate, units for adjusting volumes of gases to be taken in corresponding to the number and kinds of gas to be flown into the chamber, a unit for adjusting a pressure of gas inside the chamber, an exhaust unit for exhausting air from the chamber, and a unit for automatically controlling said chamber, said heating unit, said flow rate adjusting unit, said gas pressure adjusting unit and said exhausting unit, and the control unit controls a process of continuously or intermittently depositing amorphous thin films a plurality of times and a process of crystallizing these thin films, to form a laminated thin film structure on the semiconductor substrate. It is desirable that this device has at least one laser irradiating unit and a unit for automatically controlling this laser irradiating unit to carry out an automatic control and an automatic processing in the processes of manufacturing a semiconductor device.

The method of determining a film thickness according to the present invention is a method of determining a film thickness of deposited thin films for carrying out a process of depositing layers of amorphous materials and a process of crystallizing the amorphous material, and is characterized in that a film thickness of an amorphous layer to be deposited at one time is determined to be a level not higher than a critical stress value to be determined according to a fail event, based on a relationship between a film thickness of an amorphous layer and an average size of a crystal grain generated in a polycrystalline layer obtained by crystallizing the amorphous material and a relationship between a film thickness of a polycrystalline layer obtained by crystallizing the amorphous material and a stress generated.

Terms to be used in the specification of the present invention will be explained as follows.

Main component: This refers to a portion excluding three types of impurities; an impurity for positively carrying out doping, an impurity originally included in a raw material such as a gas or a target, and an impurity which is unavoidably mixed into a semiconductor during a manufacturing process.

Conductivity (of a thin film): This refers to a conductivity of a metal or semiconductor. In other words, volume resistivity of a semiconductor is between a metal and an insulator and is about $10^{-5}$ to $10^8$ $\Omega \cdot m$. The volume resistivity is lower as the impurity density is higher, and this shows a value near 0 at an absolute zero degree. Accordingly, when volume resistivity of a thin film is not higher than $10^8$ $\Omega \cdot m$, the thin film is said to have a conductivity according to the present invention.

Average grain size of crystal (in a deposited film surface): A density of an occurrence of a crystal nucleus differs depending on an impurity density of a deposited film and a heating condition, and this becomes 1/2 times to 10 times depending on a condition for an occurrence of a crystallization. In the present invention, a crystallization (reaction) of a grain size of about 1/2 times to 10 times of a film thickness of each divided layer is desirable.

A layer generated by a silicide reaction: A layer may be amorphous or polycrystalline at time of deposition and a film to be formed in the end should be polycrystalline.

A fail event of a semiconductor device: A collective name of various failures caused by an increase in the stress generated within a semiconductor device, such as a peeling-off between layers, a crack within a layer, or a crystalline defect.

Allowable stress level: An allowable stress value at which a fail event of a semiconductor will not occur. A permissible stress level at which a fail event will not occur varies depending on a difference in a process of manufacturing a semiconductor device, a difference in a portion at which a laminated film is used for a semiconductor device, physical characteristics of a material, a corresponding fail event, etc.

Trench capacitor: a capacitor to be used for a memory cell of a DRAM (Dynamic Random Access Memory) whose memory capacity exceeds 1 M bits. When a capacitor is provided in a side wall of a deep trench formed by etching a silicon substrate to increase capacitance, a large capacitance can be obtained even if a capacitor area becomes finer further.

LOCOS: A silicon oxide film for electrically separating among devices.

Primary recrystallization: If a range in which an atom is arrayed orderly is considered to be a crystal, it can be considered from a micro viewpoint that a crystal also exists within a substance of an amorphous state. However, primary recrystallization in the present invention refers to a phase change of an amorphous substance into a crystal, that is, a crystallization (reaction). Generally, a primary recrystallization refers to a fining of crystal grains when a material which has been cold worked and composed of many crystal defects has been heated. However, in the present invention, this term is used to emphasize that an average size of a grain is approximately a size obtained by a primary recrystallization, which is discriminated from a secondary recrystallization where a fine crystal grows large at a temperature an atom is activated.

It has been generally known that when the process of crystallizing an amorphous material is carried out at a temperature at which a primary recrystallization reaction is generated after the process of depositing films of amorphous layers, the size of a crystal grain of a film obtained by crystallizing the amorphous material becomes an order of a film thickness and a film with almost no existence of a grain boundary in the film thickness direction is formed.

The grain boundary is an incommensurate portion between crystal grains at which an atomic array directions do not agree with each other and, therefore, a region where many local defects (such as a dislocation, a lattice vacancy, and a cavity) exist.

In crystallizing an amorphous material by heat processing, when a film thickness is large, the crystal grain size becomes large and the ratio of a grain boundary which holds a higher defect density in the total film region is small, so that the ratio of a volume contraction of the film becomes large and a tensile stress within the film becomes large. On the other hand, when the film thickness is small, the crystal grain size becomes small, and a ratio of a grain boundary in the total film region becomes relatively large. Therefore, the ratio of a volume contraction becomes relatively small and a tensile stress can be minimized.

The crystal grain size referred to in this specification means an average value of a distance between adjacent grain boundaries in a direction parallel to the film surface in a desired cross section of a polycrystalline thin film in a crystallization reaction has been completed.

FIG. 15 shows an example of a measurement of a stress (crystallization stress) generated as a result of a crystallization reaction carried out within an amorphous silicon film by changing a film thickness. In FIG. 15, the horizontal axis shows a total thickness of films deposited and the vertical axis shows a stress generated inside the films as a result of a crystallization reaction when the total films deposited have been crystallized at one time. As shown by this drawing, it is clear that when the thickness of films deposited increases the stress generated at the time of the crystallization reaction increases.

Accordingly, it is effective to control the film thickness so that the stress generated by the crystallization reaction is set to be not higher than a critical stress level prescribed by each fail event, to prevent an occurrence of a peeling between thin films, cracks within thin films or a dislocation inside the semiconductor substrate.

According to the present invention, in the process of manufacturing a semiconductor device including the process of depositing amorphous layers, the thickness of amorphous layers deposited at one time is limited to be not higher than a thickness prescribed by a critical stress level determined according to a fail event, and the amorphous material is crystallized, so that the size of a crystal formed within a polycrystalline layer obtained by the primary recrystallization of the amorphous layers is limited to be on the order of a thickness of films of the amorphous layers deposited.

As a result, the size of the crystal grains formed within a polycrystalline layer is limited and the stress generated within the polycrystalline layer can be reduced to be not higher than the critical stress level at which a fail event is not generated.

By laminating the polycrystalline layers whose stress has been reduced, the film thickness of the thin film structure can be set to the thickness necessary for the specification of a design, and it is possible to prevent an occurrence of a deterioration of electric characteristics of a semiconductor device to be manufactured and defects such as peeling-off between layers and cracks within a layer induced by a stress. Thus, it is possible to obtain a high reliability of a semiconductor device to be manufactured and a high production yield of the product.

Further, in the thin film manufacturing device which can carry out the process of depositing amorphous layers and the process of crystallizing the amorphous material, it is possible to carry out the process of depositing films of amorphous layers and the process of crystallizing the amorphous material by an automatic control in an integrated process without exposing the thin films during a manufacturing process into the atmosphere.

DESCRIPTION OF THE PREFERRED EMBODIMENTS

Embodiments of the present invention will be explained below with reference to the drawings.

A first embodiment of the present invention relating to a semiconductor device and a method of manufacturing the semiconductor device based on the present invention will be explained with reference to FIGS. 1 to 14.

Figure 1:
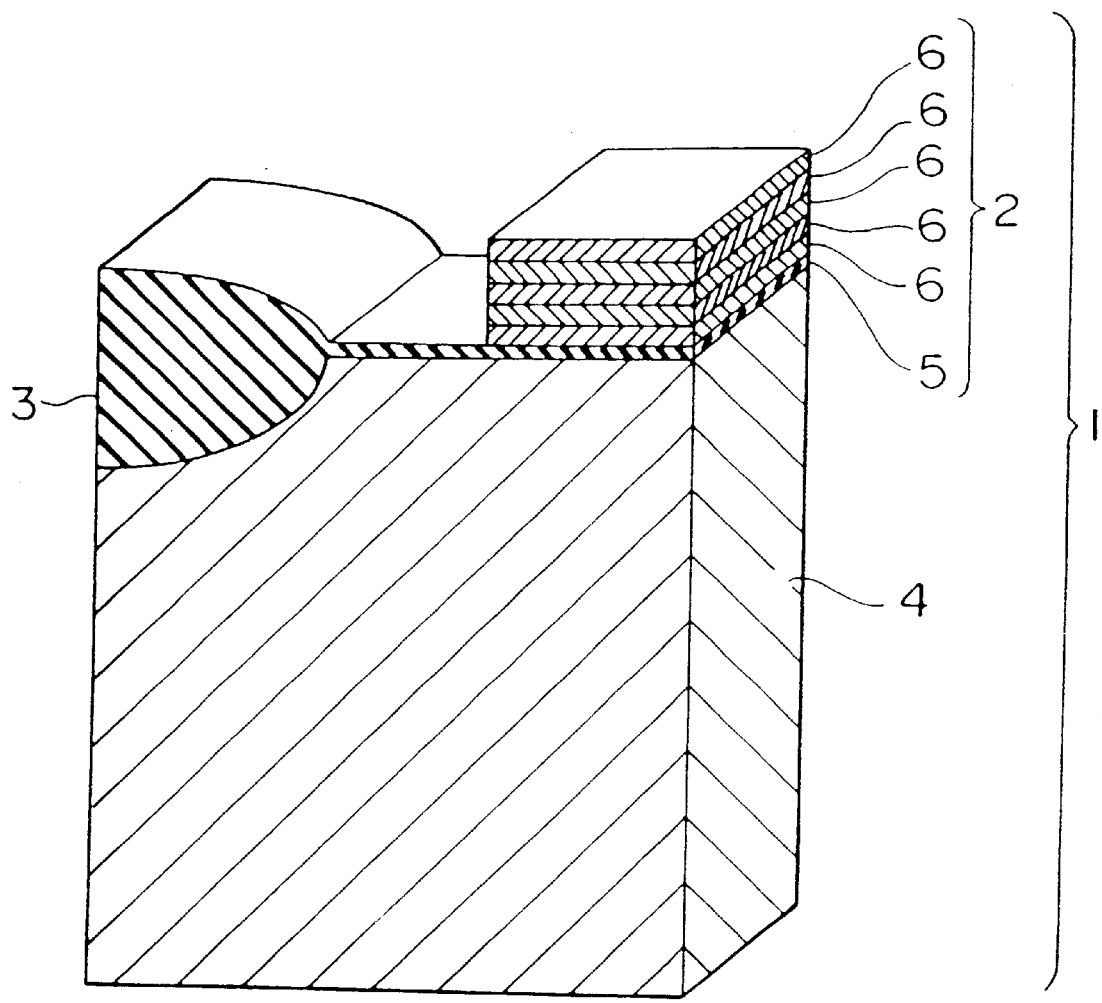
FIG. 1 is a perspective view for showing a schematic cross section of a semiconductor device in one embodiment of the present invention.

FIG. 1 is a cross sectional perspective view for showing a configuration of a semiconductor device 1 based on the embodiment of the present invention. The semiconductor device 1 shows a state that the processes of a LOCOS formation, a gate oxidization, a deposition of a gate electrode film and an etching have been completed, and the present invention is utilized as a gate electrode structure of an MOS transistor.

According to the present embodiment, on the surface of the p-type silicon semiconductor substrate 4 which is electrically insulated from the adjacent element by the LOCOS 3, a gate electrode 2 is structured by a silicon oxide film 5 formed by a heat oxidization process, and divided polycrystalline silicon layers 6 in which an impurity, such as P (phosphorus), for electrically activating silicon has been doped in high density and uniformly are laminated on the surface of the silicon oxide film 5. Each of the divided polycrystalline silicon layers 6 is in mainly columnar structure by a primary recrystallization.

The method of manufacturing the semiconductor device 1 will be explained by taking an example of manufacturing a CMOS on the p-type silicon semiconductor substrate 4 by referring to cross sectional views of the manufacturing process shown in FIGS. 2 to 14.

Figure 2:
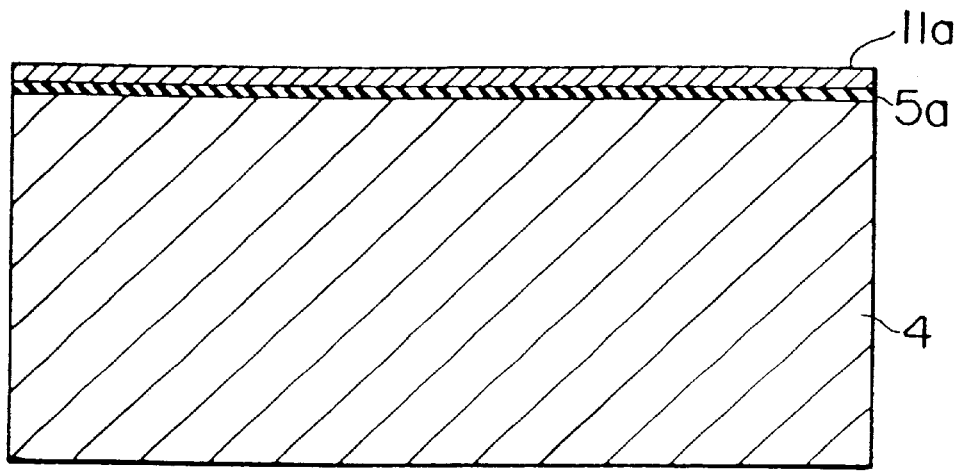
FIG. 2 is a schematic cross sectional view for showing a first manufacturing process of a semiconductor device according to the present embodiment.

A first process is shown in FIG. 2. The surface of the p-type silicon semiconductor substrate 4 is thermally oxidized to form a silicon oxide film 5a. Next, a silicon nitride film 11a is deposited on the surface of the silicon oxide film 5a by CVD (chemical vapor deposition) or the like.

Figure 3:
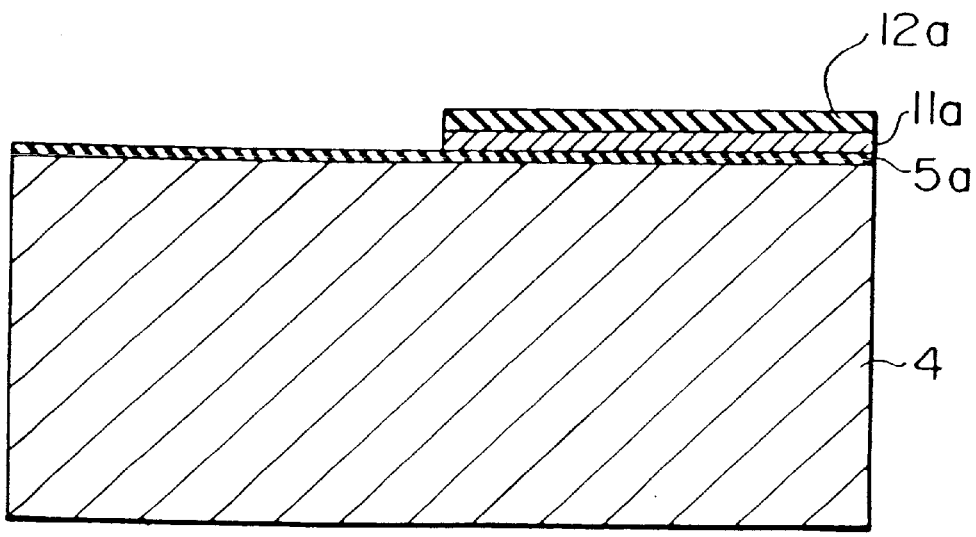
FIG. 3 is a schematic cross sectional view for showing a second manufacturing process of a semiconductor device according to the present embodiment.

A second process which continues the first process is shown in FIG. 3. A photoresist 12a is coated uniformly on the surface of the silicon nitride film 11a deposited in the process shown in FIG. 2, the photoresist 12a is patterned and the silicon nitride film 11a is etched. By controlling the flow rate of phosphine ($PH_3$), phosphorus (P) is ionized by an electric discharge and the phosphorus (P) is doped to a portion on the semiconductor substrate where the nitride silicon film 11a has been lost by the etching, with the remained silicon nitride film 11a used as a mask. Although a phosphorus (P) ion has been implanted by using phosphine, instead of this ion, an arsenic (As) ion may also be implanted by using arsine ($AsH_3$) or the like. The above ion implantation is carried out to complete an insulation between devices by using the LOCOS portion as an inverse bias.

After the second process, at a third process (FIG. 4), a thermal oxidation or the like is carried out to form a thick silicon oxide film 5a at only the area for preventing a next ion implanting.

Figure 4:
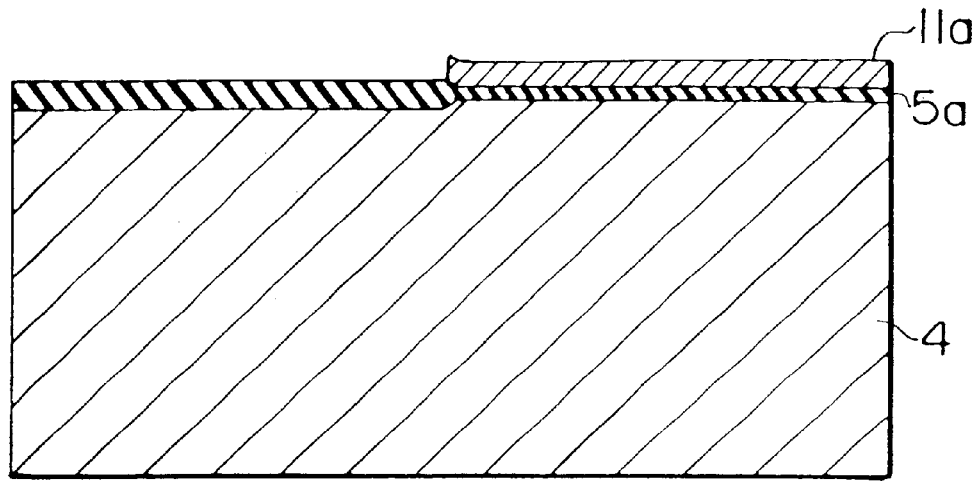
FIG. 4 is a schematic cross sectional view for showing a third manufacturing process of a semiconductor device according to the present embodiment.
Figure 5:
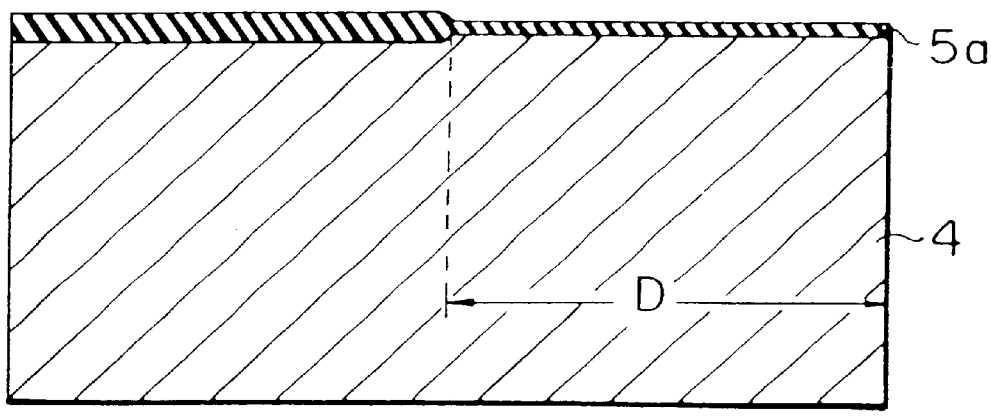
FIG. 5 is a schematic cross sectional view for showing a fourth manufacturing process of a semiconductor device according to the present embodiment.

FIG. 5 shows a fourth process. In this process, only the silicon nitride film 11a in the process of FIG. 4 is selectively etched to remove this portion. Next, a boron ion is generated by an electric discharge from boron trifluoride ($BF_3$) to dope the boron ion to the p-type silicon semiconductor substrate 4. The p-type silicon semiconductor substrate 4 is amorphous in this state because of a damage due to the ion implantation, or even if the p-type silicon semiconductor substrate 4 is mono-crystal it shows a very high volume resistivity because of electrical inactivity due to an existence of many lattice defects. Accordingly, by carrying out a thermal annealing, the impurity that has been doped is diffused and the p-type silicon semiconductor substrate 4 is recovered.

Figure 6:
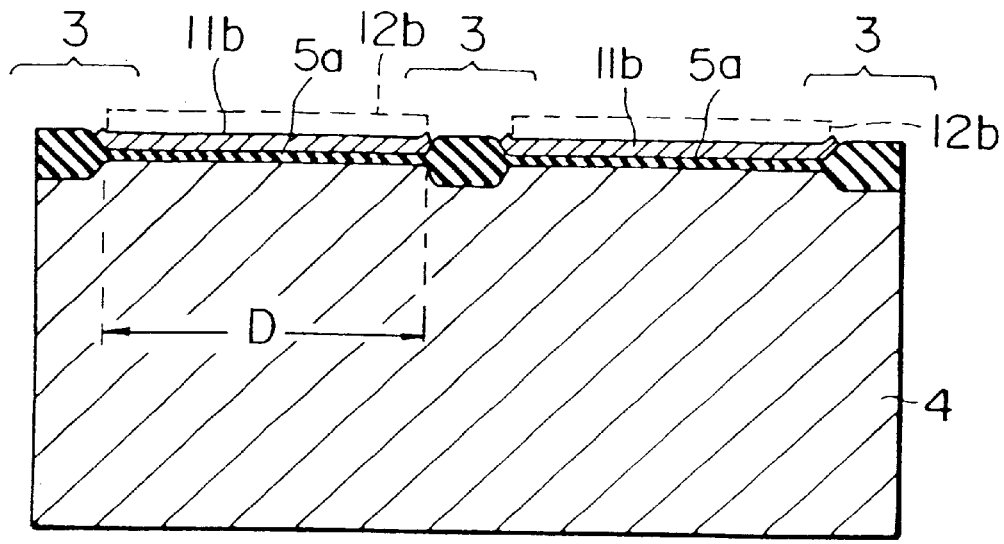
FIG. 6 is a schematic cross sectional view for showing a fifth manufacturing process of a semiconductor device according to the present embodiment.

FIG. 6 shows a fifth process. A silicon nitride film 11b is deposited by a CVD method or the like and a portion for forming a LOCOS 3 is etched to provide a mask. After removing a remaining photoresist 12b, the LOCOS 3 is formed by a wet oxidation or the like.

Figure 7:
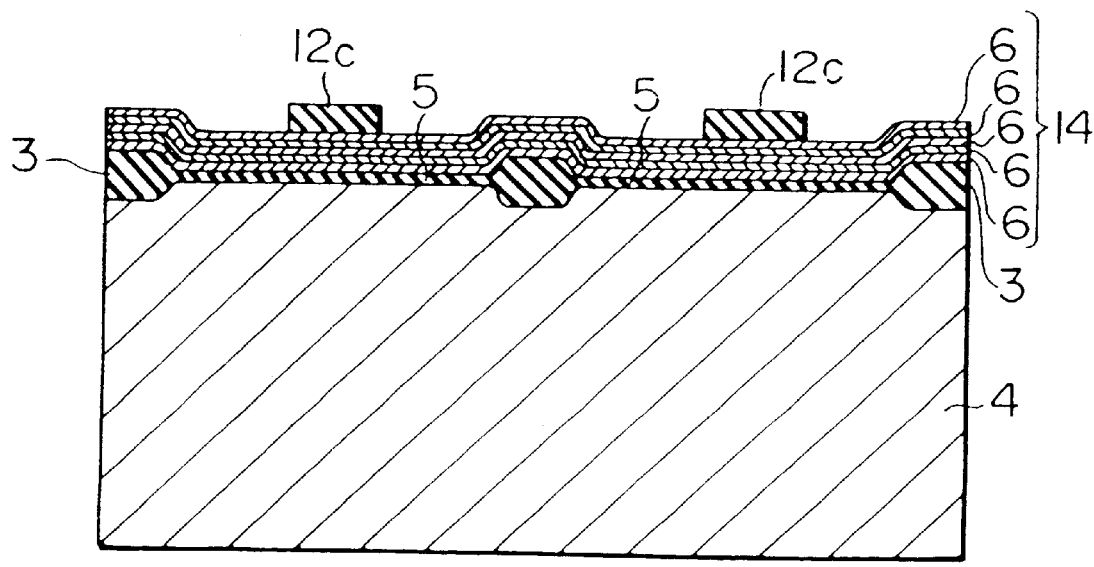
FIG. 7 is a schematic cross sectional view for showing a sixth manufacturing process of a semiconductor device according to the present embodiment.

Next, in a sixth process shown in FIG. 7, the silicon nitride film 11b used for forming the LOCOS 3 is removed by using thermal phosphoric acid or the like and the silicon oxide film 5a except the LOCOS 3 is also removed by etching. On the surface of the exposed p-type silicon semiconductor substrate 4, a new thin silicon oxide film 5 is formed as a gate electrode oxide film by a thermal oxidation again.

After this process, a process of depositing a gate electrode material is carried out. The method of manufacturing the gate electrode 2 by laminating the divided polycrystalline silicon layers 6 in which an impurity for electrically activating silicon has been doped in a high density and a uniform density, shown in FIG. 1, will be explained with reference to FIG. 14.

Figure 14:
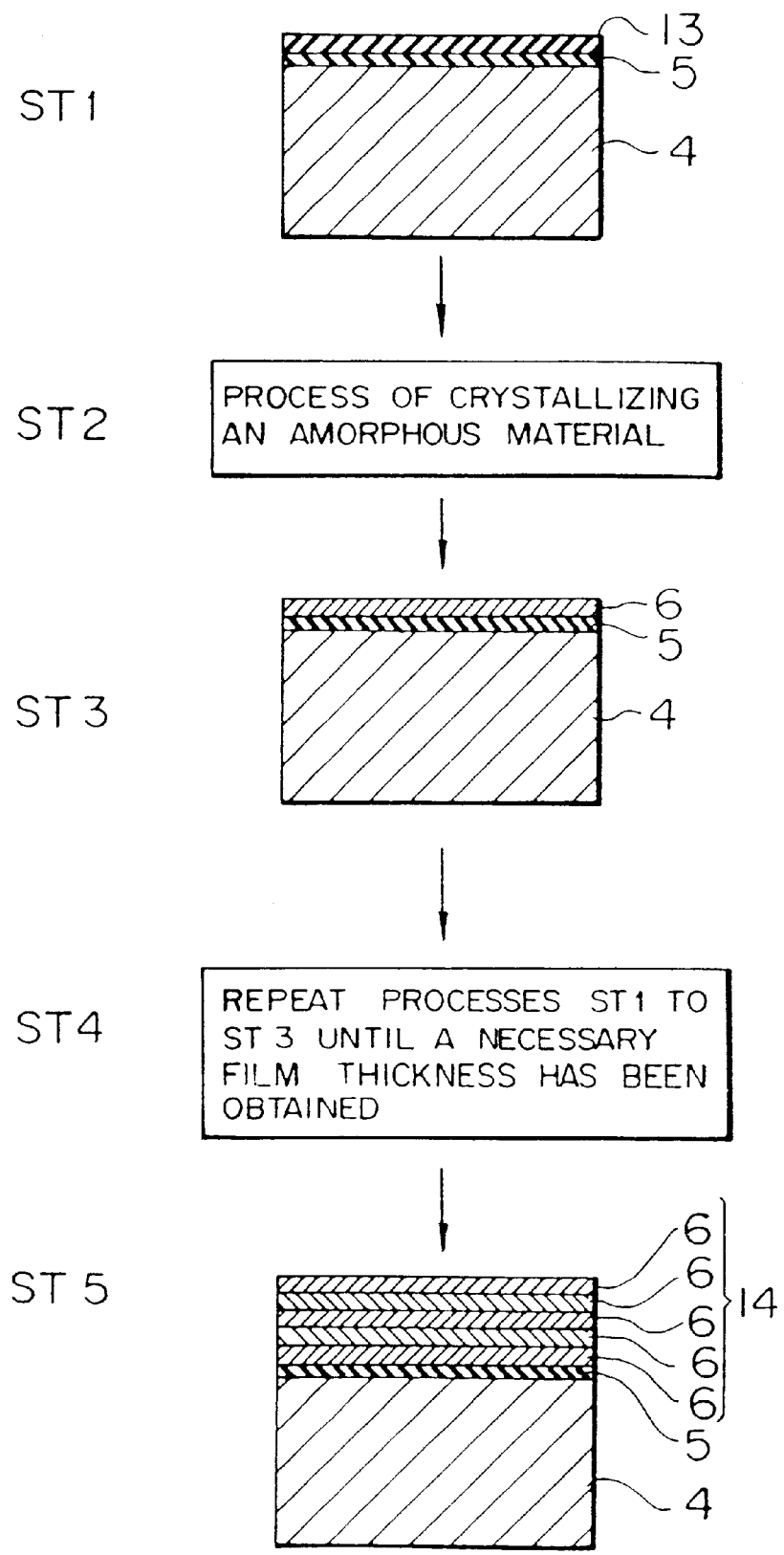
FIG. 14 is a schematic cross sectional view for showing a manufacturing process of conductive thin films of a semiconductor device according to the present embodiment.
Figure 15:
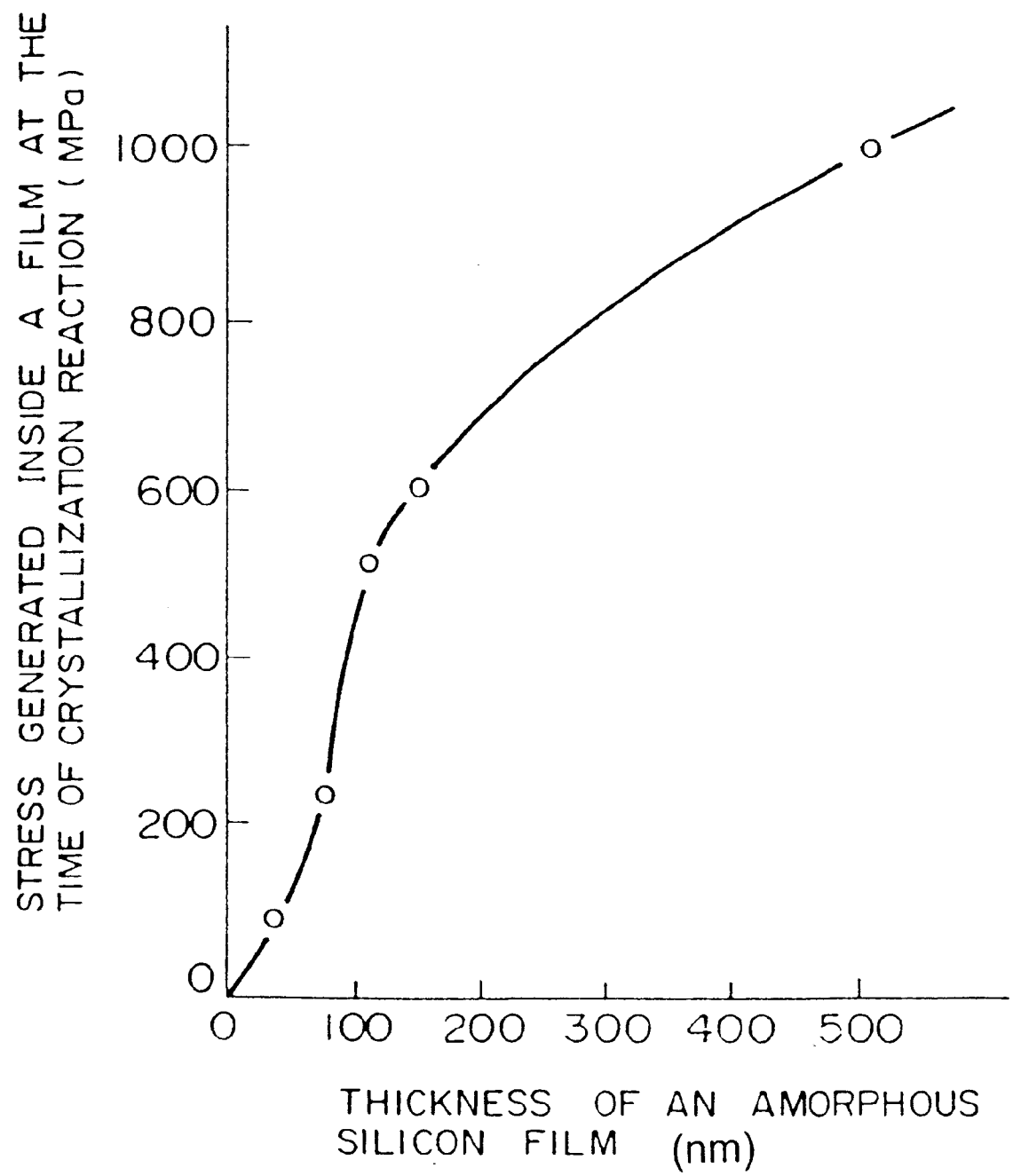
FIG. 15 is a graph for showing a relationship between thickness of films and a crystallization reaction in amorphous silicon thin films for explaining the operation of the present invention.

FIG. 14 is a cross section of the process for manufacturing the gate electrode 2, based on the present invention, shown in FIG. 1, for a semiconductor device having the divided polycrystalline silicon layers 6 in which an impurity for electrically activating silicon has been doped in a high density and a uniform density.

A process ST1 of FIG. 14 will be explained first. Temperature of a semiconductor substrate is controlled, for example, in order to deposit amorphous silicon by vapor-phase reacting disilane $Si_2H_6$ and phosphine $PH_3$ gases. Then, divided amorphous silicon layer 13 is deposited on the surface of the p-type silicon semiconductor substrate 4 on which the silicon oxide film 5 was formed by the gate oxidation at the preceding process, by a CVD or the like, at a film thickness to be deposited at one time film formation not larger than a film thickness prescribed by a critical stress determined according to a fail event. In this case, density of the impurity phosphorus (P) within the divided amorphous silicon layers 13 is uniform.

In the above example, temperature of the semiconductor is used as a factor for controlling the deposited phase of silicon, it is needless to mention that other factors, such as a pressure or a flow rate of a gas, for example, may also be controlled. In the case of depositing amorphous silicon thin films, monosilane $SiH_4$ may also be used.

Processes ST2 to ST3 in FIG. 14 will be explained next. By holding the temperature of the semiconductor substrate 4 at 600° C. or above, the amorphous silicon is crystallized and the divided polycrystalline silicon layers are formed. The stress generated in the divided polycrystalline silicon layers 6 is restricted to be not higher than a critical stress level as the film thickness of the divided amorphous silicon films 13 is limited to be not higher than the film thickness prescribed by the critical stress level determined according to a fail event. The amorphous material may be crystallized by controlling the temperature of the semiconductor substrate or may also be crystallized by irradiating a laser. Crystallization of the amorphous material by a laser irradiation may be applied for the crystallization of the whole surface of the divided amorphous silicon layers 6 deposited on the semiconductor substrate 4 or for a local crystallization of the divided amorphous silicon layers 6 by an irradiation at a local position.

At processes ST4 in FIG. 14, the processes ST1 to ST3 in FIG. 14 are repeated until the total film thickness of the laminated divided polycrystalline silicon layers 6 has reached a required thickness. By repeating this process, divided polycrystalline silicon film 14 with a low stress is formed at process ST5 in FIG. 14.

Figure 8:
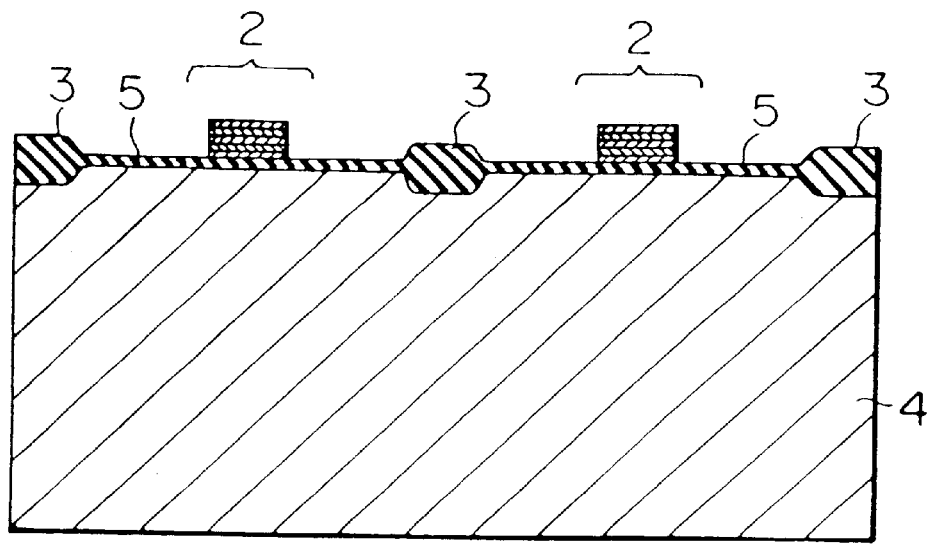
FIG. 8 is a schematic cross sectional view for showing a seventh manufacturing process of a semiconductor device according to the present embodiment.

After the process of FIG. 14, a photoresist 12c (reference FIG. 7) is coated on the surface of the divided polycrystalline silicon film 14 to carry out a process of patterning, and the divided polycrystalline silicon film 14 is etched, so that the gate electrodes 2 of the structure having the laminated polycrystalline silicon layers 6 can be finally formed as shown in the process of FIG. 8.

Accordingly, by laminating the polycrystalline silicon layers 6 of which an impurity for electrically activating, such as phosphorus (P), is of high density and uniform density, a cross section area or a film thickness which does not cause an excessive electric resistance can be obtained. As an average size of the crystal grain of the polycrystalline silicon thus formed is small, it is possible to obtain the gate electrode 2 having structure of the laminated divided polycrystalline silicon layers 6, with stress generated within the film restricted to be not higher than the critical stress.

Figure 27:
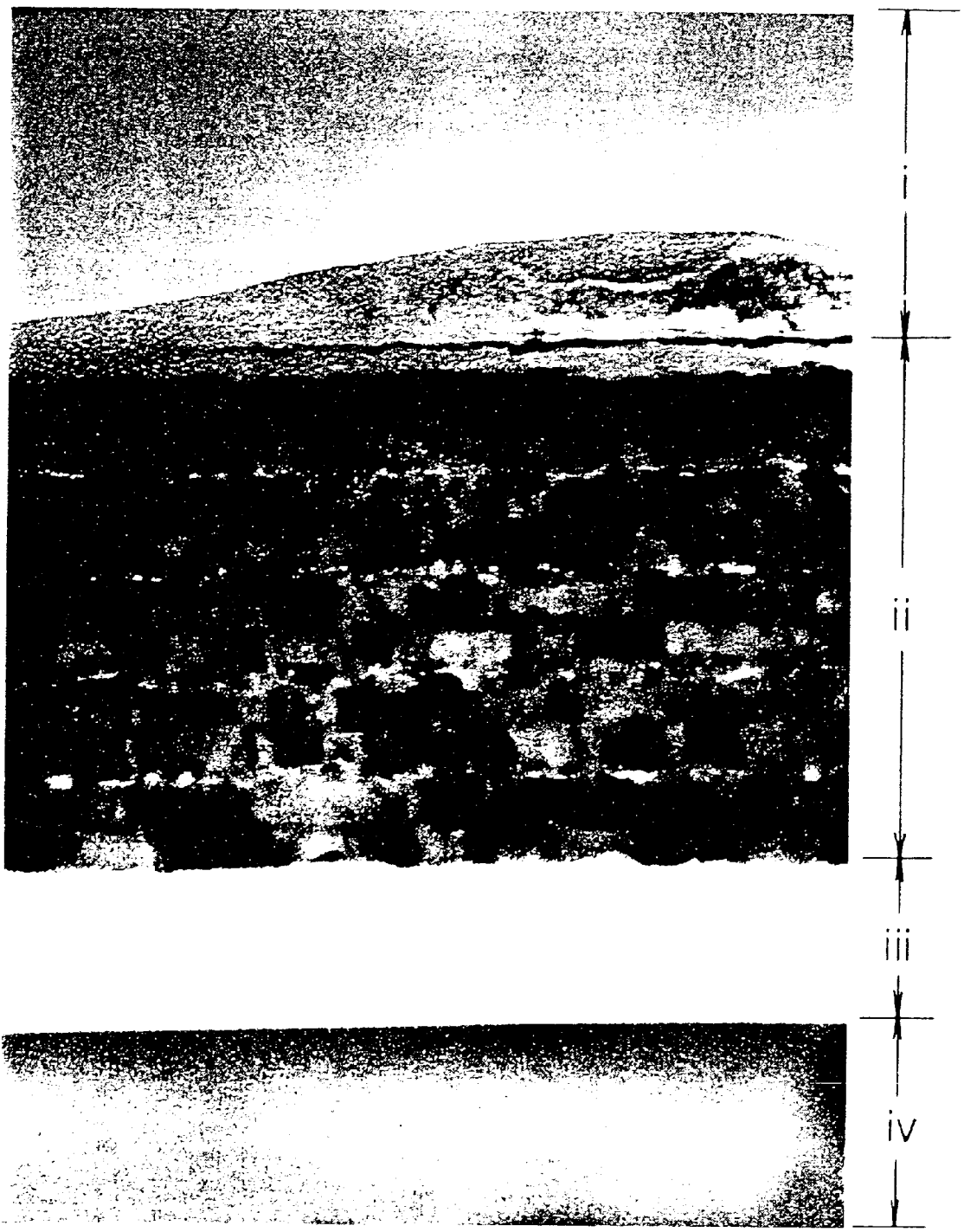
FIG. 27 is a microscopic photograph for showing a cross section of a laminated structure shown in FIG. 26.

FIG. 27 shows a photograph, of an example of an observation by an electron microscope, of a thin film having a structure of laminated polycrystalline layers which has been formed by depositing amorphous silicon and crystalline cobalt layers alternately and then forming polycrystalline layers with columnar structure by a primary recrystallization reaction. Its magnification is about 180 thousand times.

As shown in FIG. 27, the laminated structure of the divided polycrystalline silicon layers 6 can be also observed by an electron microscope and this structure is clearly different from a structure obtained by depositing a polycrystalline material layer having necessary thickness in that clear borders of divided layers can be recognized in this picture.

Figure 9:
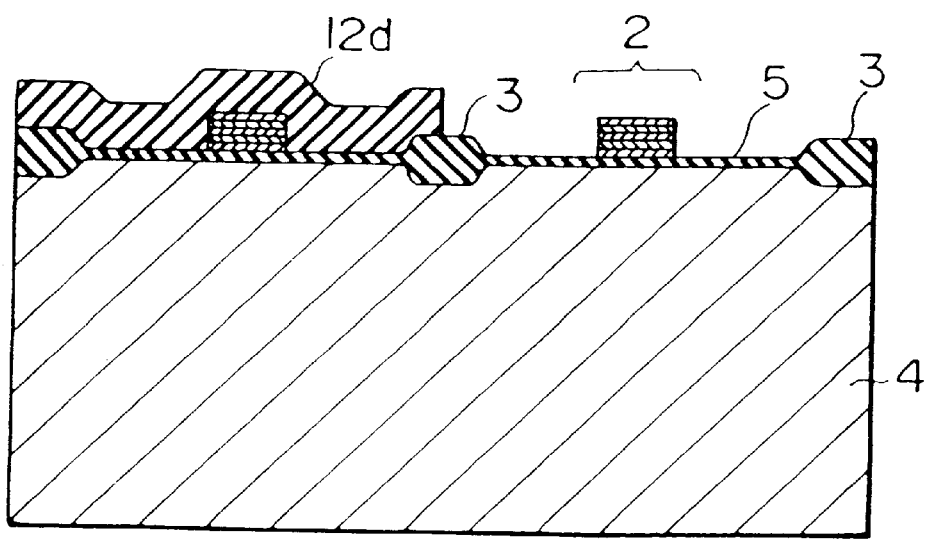
FIG. 9 is a schematic cross sectional view for showing an eighth manufacturing process of a semiconductor device according to the present embodiment.

An eighth process which continues will be explained with reference to FIG. 9. A photoresist 12d is coated on the p-type silicon semiconductor substrate to carry out a patterning. In this case, with the remaining photoresist 12d used as mask, a phosphorus (P) or arsenic (As) ion is implanted to form a source and a drain of an n-channel MOS transistor.

Figure 10:
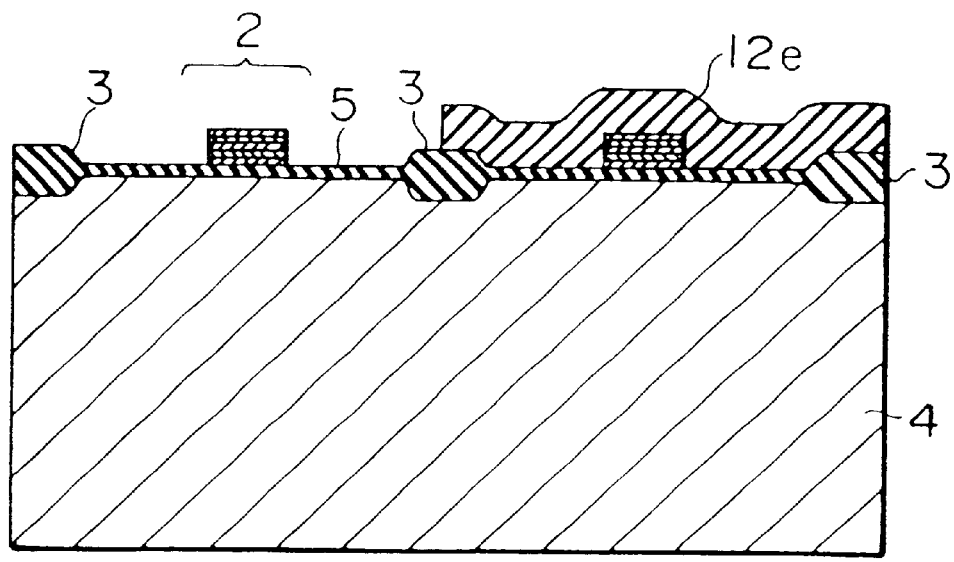
FIG. 10 is a schematic cross sectional view for showing a ninth manufacturing process of a semiconductor device according to the present embodiment.

FIG. 10 shows a ninth process. At first, the photoresist used in the process of FIG. 9 is removed and a photoresist 12e is coated on the p-type silicon semiconductor substrate 4 to carry out a patterning. Then, a boron (B) ion or the like is implanted to form a source and a drain of the p-channel MOS transistor. Thermal annealing is carried out to diffuse the doped ion.

Figure 11:
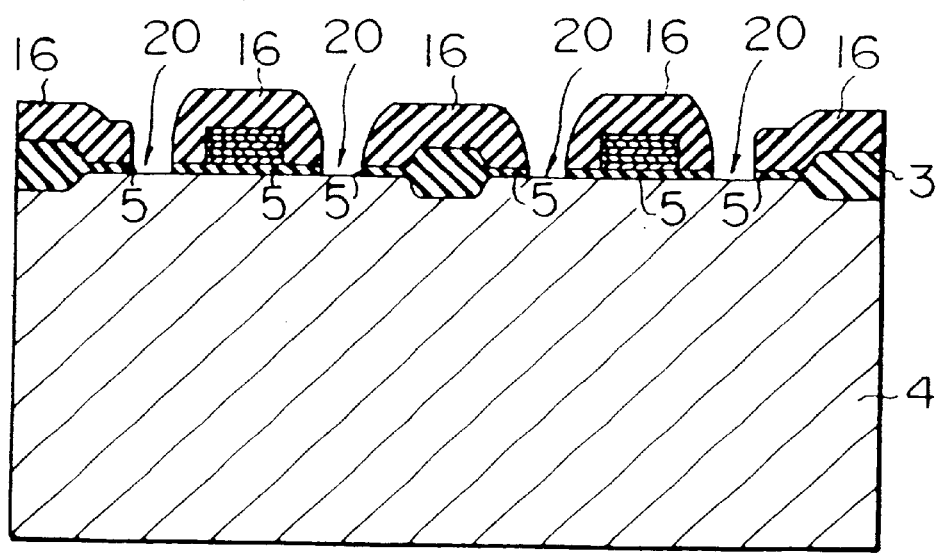
FIG. 11 is a schematic cross sectional view for showing a tenth manufacturing process of a semiconductor device according to the present embodiment.

At a following tenth process shown in FIG. 11, the photoresist 12e used at the process of FIG. 10 is removed and the p-type silicon semiconductor substrate 4 is covered with an inter-layer insulation film 16 such as phosphorus glass or the like. Holes 20 for obtaining an electrical contact with the substrate are obtained by etching.

Figure 12:
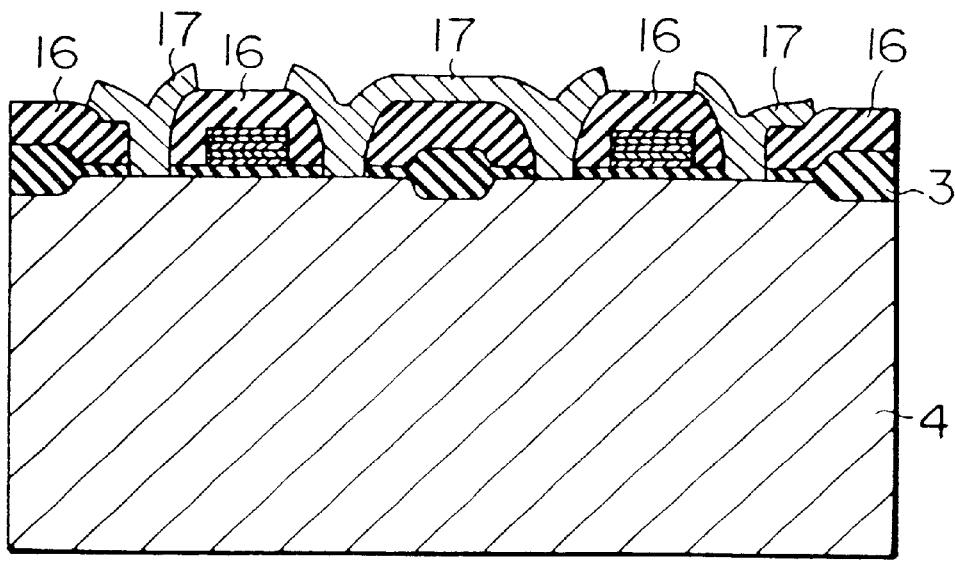
FIG. 12 is a schematic cross sectional view for showing an eleventh manufacturing process of a semiconductor device according to the present embodiment.
Figure 13:
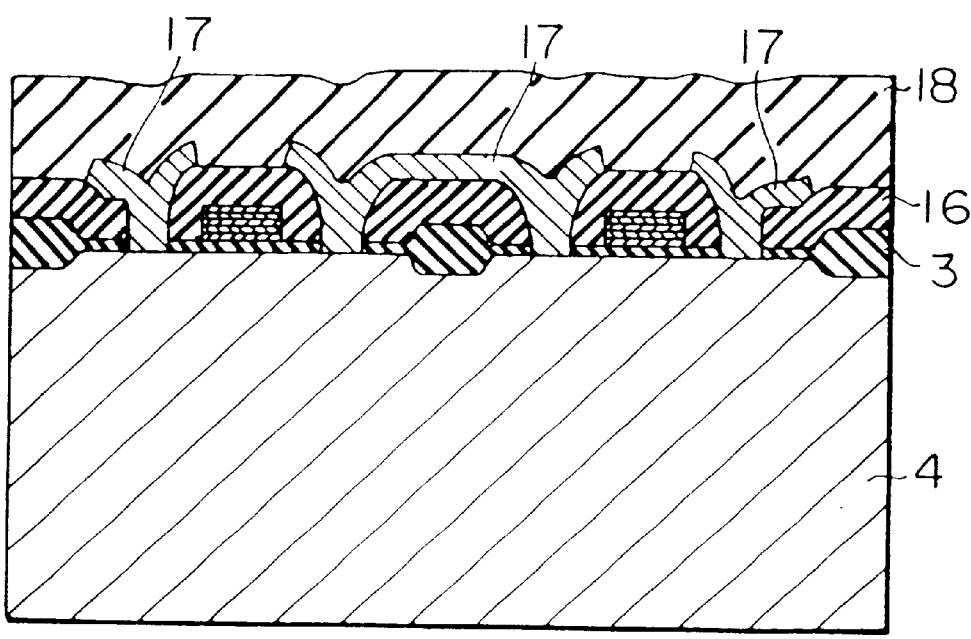
FIG. 13 is a schematic cross sectional view for showing a twelfth manufacturing process of a semiconductor device according to the present embodiment.

FIG. 12 (an 11th process) shows the processes of sputtering a wiring material film such as an aluminum alloy film or the like on the surface of the p-type silicon semiconductor substrate 4 and patterning this film, to obtain an aluminum alloy wiring layer 17. In FIG. 13 (a 12th process), in order to passivate the formed semiconductor device, the whole surface of the substrate is covered by an insulation film (a passivation film) 18 thus ending the whole process. In the case of the semiconductor device having a multi-layer wiring, a hole for obtaining a further electrical contact is etched after the 12th process and then the next wiring is sputtered. A wiring to a gate electrode is sputtered by a known technique not shown.

Although in the first embodiment, a p-type silicon semiconductor substrate 4 has been used as a semiconductor substrate, it is needless to mention that this should not necessarily be the p-type but an n-type silicon semiconductor substrate may also be used. In this case, some modification to the manufacturing process is necessary. A gallium arsenic semiconductor substrate or others may also be used instead. Although polycrystalline silicon has been used as the material for the gate electrode 2, other conductive material can also be used when it can be deposited in an amorphous phase and when it is crystallized. Although P (phosphorus) has been used as an impurity, another impurity such as B (boron), As (arsenic), etc. may also be used instead.

Another embodiment relating to a semiconductor device and a method of manufacturing the semiconductor device according to the present invention will be explained with reference to FIGS. 16 and 17.

Figure 16:
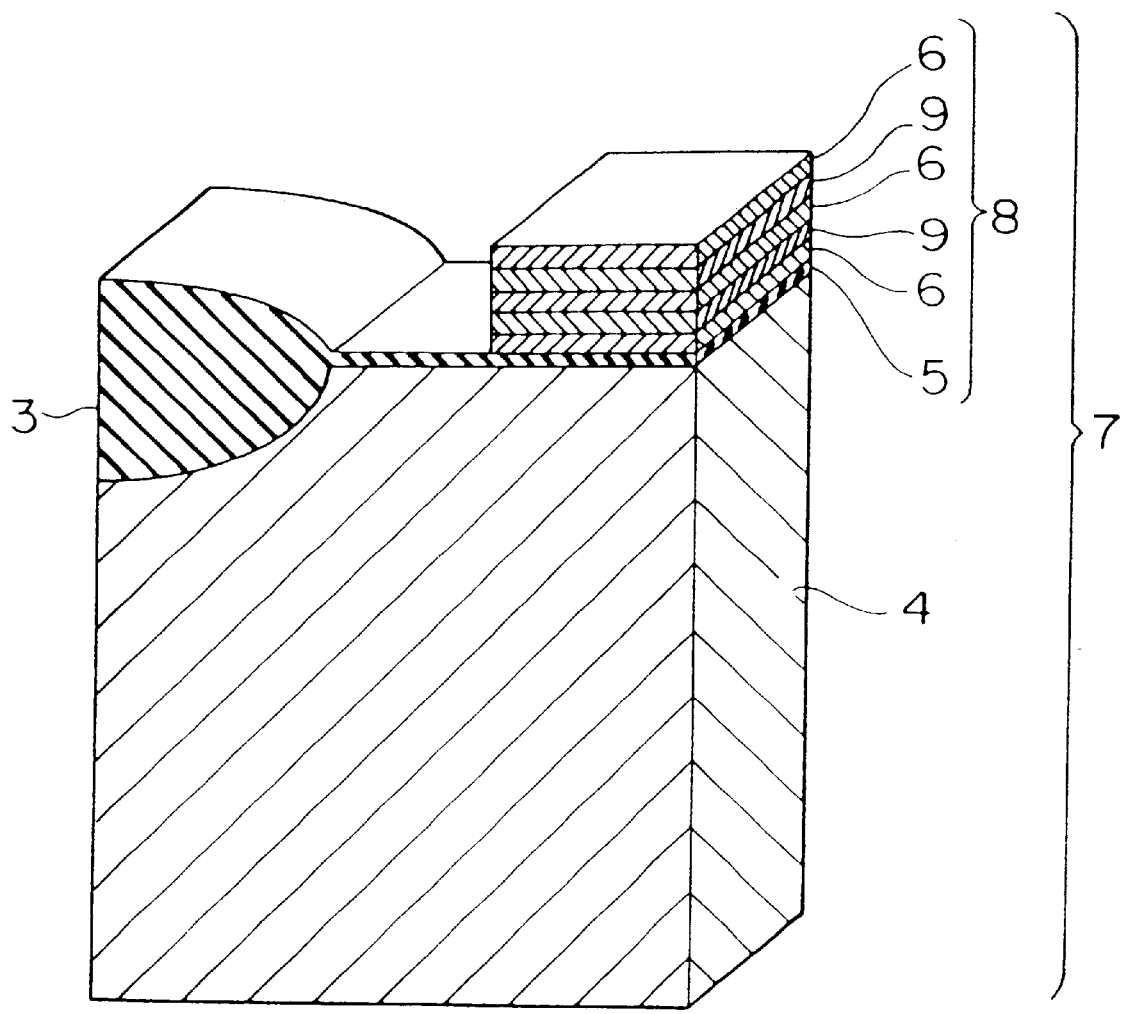
FIG. 16 is a perspective view for showing a schematic cross section of a semiconductor device in another embodiment of the present invention.

FIG. 16 is a cross section perspective view for showing a structure of the semiconductor device 7 according to the other embodiment of the present invention. A semiconductor device 7 shows a state that a LOCOS deposition, a gate oxidation, a film formation for the gate electrode and an etching process have been completed. The method of manufacturing a semiconductor device based on the present invention is utilized for providing a gate electrode structure of the MOS transistor in the same manner as in the first embodiment.

A gate electrode 8 according to one embodiment of the manufacturing method is formed on the surface of a silicon oxide film 5 formed by a thermal oxidation on the surface of a p-type silicon semiconductor substrate 4 which is electrically insulated from an adjacent device by a LOCOS 3. Divided polycrystalline silicon layers 6 into which an impurity such as P (phosphorus) or the like for electrically activating silicon has been doped in a high density and a uniform density and a material such as an aluminum alloy layer 9 which is different from polycrystalline silicon including only silicon as a main component are laminated alternately.

Except the gate electrode 8, this semiconductor device 7 can be obtained by a manufacturing method similar to the manufacturing method of the semiconductor device 1 shown in the first embodiment. Therefore, only the method of manufacturing the gate electrode 8 will be explained with reference to the process in FIG. 7 and FIG. 17.

A method of manufacturing the semiconductor device 7 is the same as that of the first embodiment up to the middle of the process of FIG. 7. After ending the process of FIG. 6, a silicon nitride film 11b used for forming the LOCOS 3 in the process of FIG. 7 is eliminated by using hot phosphoric acid, and a silicon oxide film 5a other than LOCOS 3 is eliminated by an etching. On the exposed surface of the p-type silicon semiconductor substrate, a new thin silicon oxide film 5 is formed as an oxide film for the gate electrode by a thermal oxidation again.

After this process, a process for forming a film by using a gate electrode material is carried out. Next, by referring to FIG. 17, description will be made of a method of manufacturing the gate electrode 8 having a structure that a laminated thin film of divided polycrystalline silicon layers 6 into which an impurity (such as P, for example) for electrically activating silicon has been doped in a high density and a uniform density are separated from each other by aluminum alloy layers 9 which are made of a material different from the polycrystalline silicon which uses only silicon as a main component.

Figure 17:
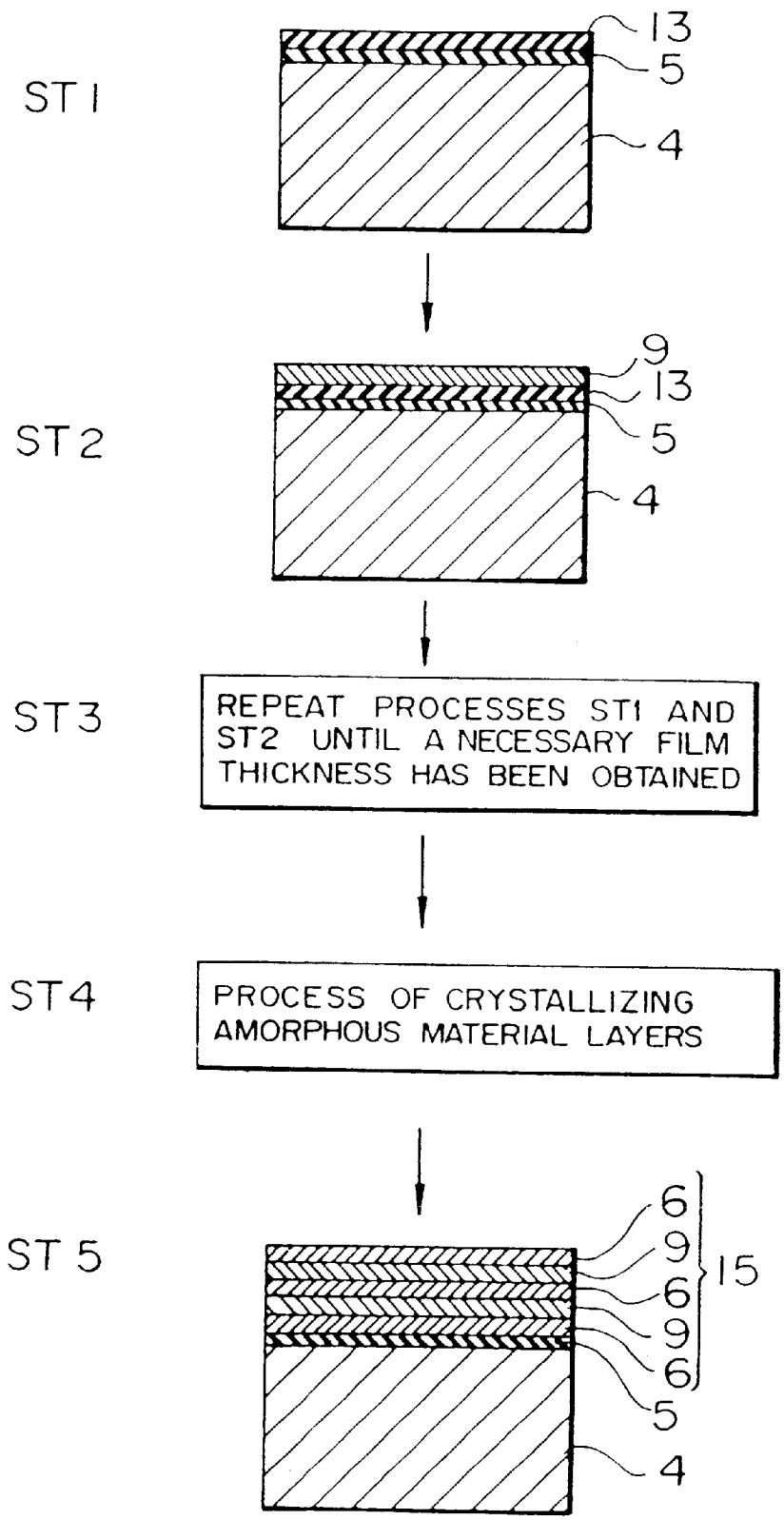
FIG. 17 is a schematic cross sectional view for showing a manufacturing process of conductive thin films of a semiconductor device according to the present embodiment.

FIG. 17 is a cross section of the process for showing the method of manufacturing the gate electrode 8 of the semiconductor device 7 according to the second embodiment of the present invention.

A process ST1 of FIG. 17 will be explained below. After forming the silicone oxide film 5 for the gate electrode, a gas including an impurity to be doped such as disilane ($Si_2H_6$) and phosphine ($PH_3$), for example, is flown on the surface of the silicon oxide film 5 to carry out a vapor phase reaction. Then, a divided amorphous silicon layer 13 in a film thickness not larger than a thickness prescribed by a critical stress to be determined according to a fail event is deposited by a CVD (chemical vapor deposition) or the like. Monosilane $SiH_4$ may also be used for a deposition of amorphous silicon thin films.

A process ST2 of FIG. 17 will be explained next. A material different from the film deposited in the process ST1, such as aluminum alloy layers 9 is are deposited by sputtering or the like. The material to be deposited by sputtering may also be other conductive material such as silicide compound. A film thickness of the aluminum alloy layers 9 to be deposited is the thickness at which an atom within each divided amorphous silicon layer may scarcely move to other divided amorphous silicon layers by a thermal diffusion in the subsequent process of crystallizing the divided amorphous silicon layers.

In a process ST3 of FIG. 17, the processes ST1 to ST2 are repeated until the total laminated layer thickness of the divided amorphous silicon layers 13 and the polycrystalline aluminum alloy layers 9 becomes larger than a necessary thickness.

A process ST4 of FIG. 17 will be explained next. When the total laminated layer thickness of the divided amorphous silicon layers 13 and the polycrystalline aluminum alloy layers 9 has reached the necessary thickness, the temperature of the semiconductor substrate is controlled to at least a temperature at which the amorphous silicon is crystallized, for example 600° C. or above, to crystallize the whole divided amorphous silicon layers 13.

After this manufacturing process of FIG. 17, the laminated thin film of the divided amorphous silicon layers 13 and the polycrystalline aluminum alloy layers 9 is patterned, to obtain the gate electrode 8 which has the structure that a laminated thin film of divided polycrystalline silicon layers 6 into which an impurity such as P (phosphorus) for example for electrically activating silicon has been doped in a high density and a uniform density is stacked with an aluminum alloy layers 9 which is made of a material different from the polycrystalline silicon which uses only silicon as a main component. A symbol 15 designates a thin film having a structure of alternate laminated layers of polycrystalline silicon and the other material.

This manufacturing process does not require a crystallization process of an amorphous material after each process of depositing an amorphous film as in the first embodiment. With only one crystallization process after ending the whole film depositing process, the structure of the electrode 8 based on this embodiment of the present invention can be obtained, which leads to a reduction in the number of processes.

For the material which is different from amorphous silicon to be deposited in the process ST2 of FIG. 17, a metal which carries out silicide reaction such as tungsten or cobalt can be used instead of an aluminum alloy. Silicide reaction is progressed at an interface between each divided amorphous silicon layer 13 and each silicide reacting metal layer so that a thin film of the structure having a lamination of silicide layers can be formed.

Thus, by setting the film thickness of each divided silicide layer obtained in this case to be not larger than the film thickness prescribed by a critical stress level to be determined according to a fail event, the stress generated within each divided polycrystalline silicide layer can be minimized to be within the critical stress level.

As explained above, by providing each amorphous material layer to have a thickness within the prescribed thickness while sandwiching other material layers between the amorphous material layers, the process of crystallizing the amorphous material can be reduced to only one at the time of ending the whole process.

However, in general, the stress generated is lower when crystallization and shrinkage is carried out in the state when the surface boundary condition of the amorphous material layer is free. Therefore, crystallization may be carried out each time after the completion of depositing a film of each divided amorphous material layer. It is also good to carry out an irradiation of a laser beam to a local portion of the divided amorphous material layer, selectively apply a low stress to the local portion and crystallize the portions, not directly related to a failure, at the time of the completion of the whole process.

By using the above-described method of manufacturing a semiconductor device, it is possible to manufacture a gate electrode without causing a stress generated within the film of the gate electrode to exceed a critical stress level corresponding to a fail event and with a target film thickness and with a low resistance of a uniform and high impurity density, in the same manner as in the first embodiment. Thus, a highly reliable product can be provided.

Although the p-type silicon semiconductor substrate 4 has been used as a semiconductor substrate in the second embodiment, the semiconductor substrate need not be the p-type but an n-type silicon semiconductor substrate can also be used. A gallium arsenide semiconductor may also be used as an alternative. Although polycrystalline silicon has been used as the material for the gate electrode 8, other conductive material may also be used when this can be deposited in an amorphous state and when it is crystallized. Although P (phosphorus) has been used as an impurity, other impurity such as B (boron) or As (arsenic) may also be used.

Another embodiment of a semiconductor device structure manufactured by using the method of manufacturing a semiconductor device based on the present invention will be explained with reference to FIGS. 18 to 24.

FIGS. 18 to 24 are cross sections in the embodiment of the semiconductor structure according to the present invention. The present invention is used to bury a trench (a rugged surface) formed on the surface of the p-type silicon semiconductor substrate 4 with polycrystalline silicon layers 6.

Figure 18:
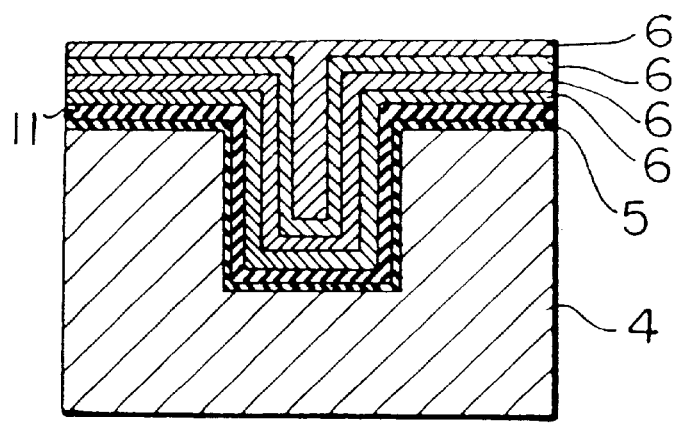
FIG. 18 is a schematic cross sectional view for showing a manufacturing process of a laminated layer structure of conductive thin films of a semiconductor device according to the present invention.
Figure 19:
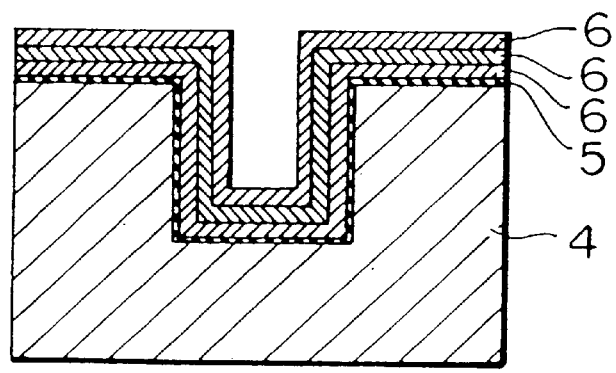
FIG. 19 is a schematic cross sectional view for showing a manufacturing process of a laminated layer structure of conductive thin films of a semiconductor device according to the present invention.

FIG. 18 shows an example that the present invention is utilized for a trench-type memory cell, according to which a silicon oxide film 5 is formed as an insulation film in a trench on the surface of the p-type silicon semiconductor substrate 4 and then the polycrystalline silicon layers 6 are deposited to fill the trench. As shown in FIG. 19, this trench may not necessarily be completely filled with the polycrystalline silicon layers 6.

Figure 20:
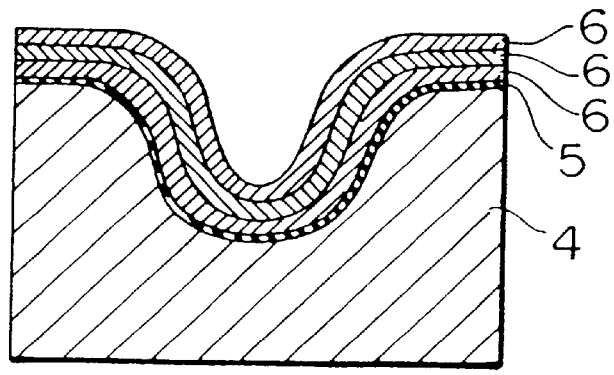
FIG. 20 is a schematic cross sectional view for showing a manufacturing process of a laminated layer structure of conductive thin films of a semiconductor device according to the present invention.
Figure 21:
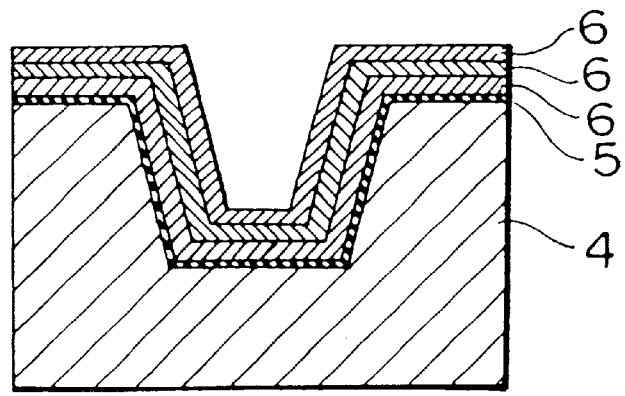
FIG. 21 is a schematic cross sectional view for showing a manufacturing process of a laminated layer structure of conductive thin films of a semiconductor device according to the present invention.
Figure 22:
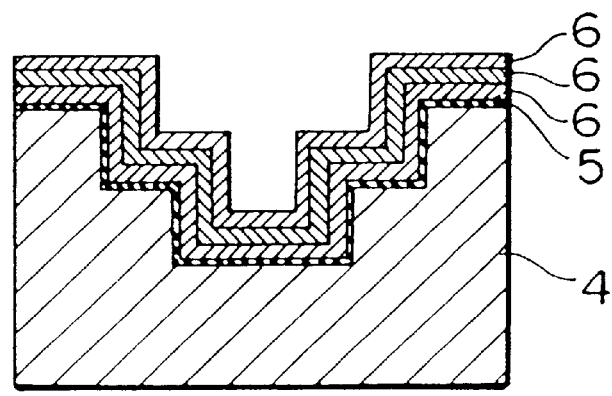
FIG. 22 is a schematic cross sectional view for showing a manufacturing process of a laminated layer structure of conductive thin films of a semiconductor device according to the present invention.

FIG. 20 shows an example that polycrystalline silicon layers 6 are deposited on the surface of the p-type silicon semiconductor substrate 4 of which corner portions have been rounded by an isotropic etching or the like or the corners have been lost by covering them with an inter-layer insulation film for flattening the corners. FIG. 21 shows an example that the side surface of trench and step portions is tapered. FIG. 22 shows an example that there is a rugged surface at the side surface of trench and step portions. There is no roundness at the corners and stress is concentrated when the corner is acute, with a severe structure.

Figure 23:
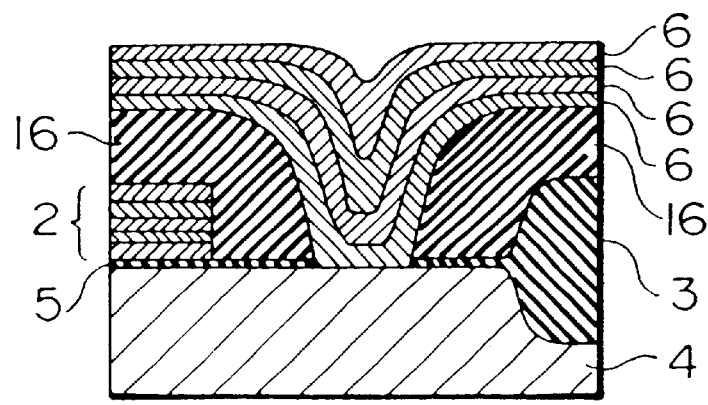
FIG. 23 is a schematic cross sectional view for showing a manufacturing process of a laminated layer structure of conductive thin films of a semiconductor device according to the present invention.
Figure 24:
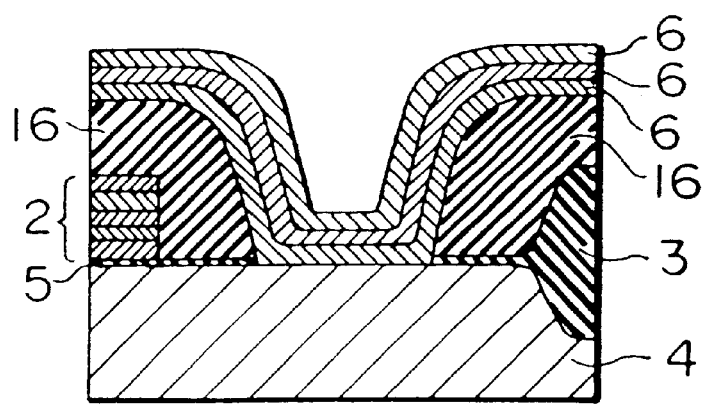
FIG. 24 is a schematic cross sectional view for showing a manufacturing process of a laminated layer structure of conductive thin films of a semiconductor device according to the present invention.
Figure 25:
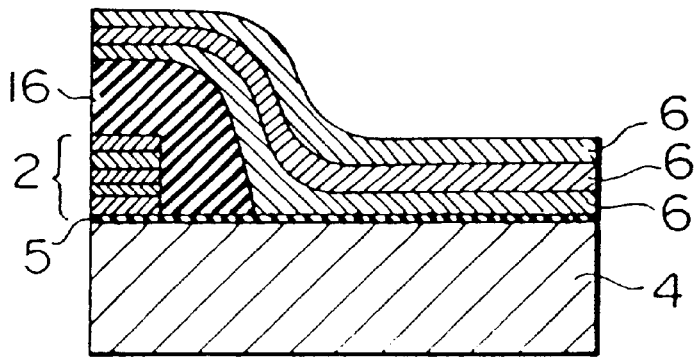
FIG. 25 is a schematic cross sectional view for showing a manufacturing process of a laminated layer structure of conductive thin films of a semiconductor device according to the present invention.

FIGS. 23 to 25 show an example that films of polycrystalline silicon layers 6 have been deposited as wiring layers at steps. Films of the wiring layers 6 are deposited on a rugged surface of the surface of a p-type silicon semiconductor substrate 4 after a gate electrode 2 and others have been covered with an inter-layer insulation film 16, and the deposition of the wiring layer films 6 is also used to take an electric contact with the substrate.

In the case of depositing and crystallizing amorphous silicon, the corner portion of the step becomes the place where stress is concentrated along with the volume contraction of the layer due to crystallization of the amorphous material, so that a large stress is applied locally as compared with a film formed on a plane portion as in the case of the first embodiment and the second embodiment.

Accordingly, when the film thickness of amorphous layers such as amorphous silicon to be formed at one time is set so that the concentrated stress will not exceed a critical stress level and this film forming process is repeated till a necessary film is reached as shown in the first and second embodiments, it is possible to prevent an occurrence of a failure when films of polycrystalline silicon layers 6 are deposited at the step when the polycrystalline silicon layers 6 are buried in the trench formed on the surface of the p-type silicon semiconductor substrate 4.

The shape of the side wall and corner of the step as shown in FIGS. 23 to 25 may be the shape as shown in FIGS. 20 to 22 or a combination of these shapes.

When an amorphous material is used to deposit films in a trench and on a step, the effect of the method of manufacturing a semiconductor device according to the present invention is best exhibited by depositing layers by setting a film thickness of the amorphous layers deposited at one time to be not larger than a critical stress value.

A similar effect can also be obtained when a structure or a manufacturing method of dividing amorphous layers with other material layers is used in the second embodiment.

In the above third embodiment, other material such as a tantalum oxide film or the like may also be used for the material of an insulation film of the trench type memory cell. Although amorphous silicon has been used for the material for layer lamination, other amorphous material may also be used instead.

Figure 26:
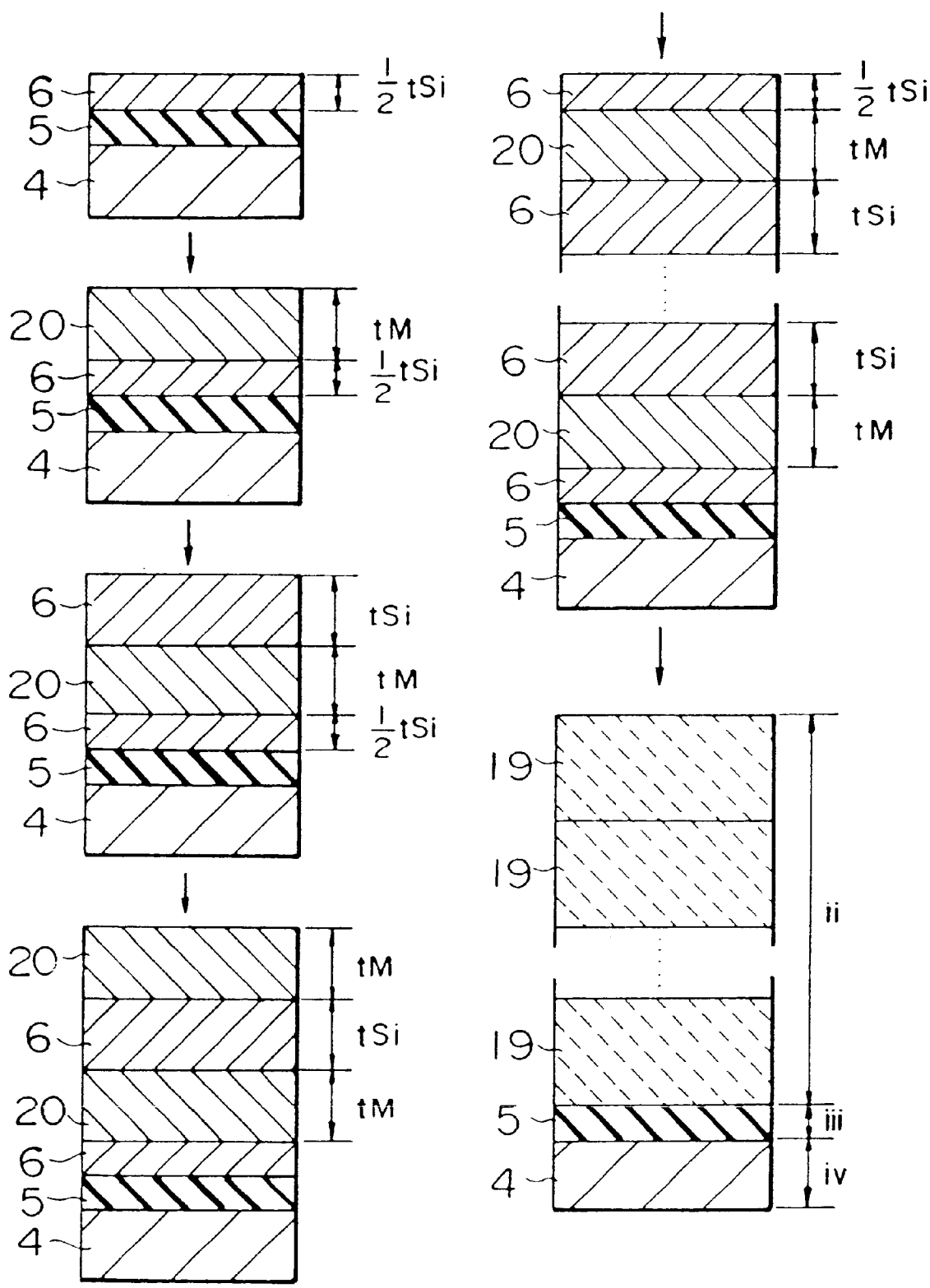
FIG. 26 is a schematic cross sectional view for showing a manufacturing process of a laminated layer structure of conductive thin films utilizing a metal silicide layer of a semiconductor device according to the present invention.

A method of manufacturing a thin film according to the present invention will be explained with reference to FIGS. 26, 27, 28 and 29. FIG. 26 explains a flow of the manufacturing of metal silicide thin film according to the present embodiment. In the present method of manufacturing a thin film, a metal silicide thin film of a composition $MSi_x$ (where M is a metal element) is obtained by a chemical reaction of $$M + xSi = MSi_x.$$

After forming a ground film (a silicon oxide film) 5 on a substrate 4, a silicon thin film 6 of a film thickness 1/2 tSi is deposited. In this case, the film thickness tSi is determined by determining a ratio (1:y) of film thickness between a metal thin film 20 and the silicon thin film 6 from a density ratio of each element so that the ratio of atoms becomes $$M:Si = 1:x$$

when the composition of the metal silicide film to be finally obtained is $MSi_x$ (where M is a metal element). In other words, the following relation is obtained:

$$tM:tSi = 1:y \qquad (1)$$

Consider a ratio (1:z) of a film thickness tMSi which is two times the film thickness calculated from the thickness of the metal silicide thin film per one layer to be prescribed by a fail event to be obtained in the end to a film thickness of the sum of the film thickness tSi of the silicon thin film and the film thickness tM of the metal thin film, that is $$tMSi:(tSi+tM) = 1:z \qquad (2)$$

By eliminating tM from the expressions (1) and (2), the following expression is obtained:

$$tSi = (yz)tMSi/(1+y) \qquad (3)$$

Then a metal thin film to be determined by a film thickness shown below is deposited as the film of the second layer $$tM = ztMSi/(1+y) \qquad (4)$$

For a third layer, a silicon thin film of the film thickness tSi is deposited. The metal thin film 20 of the film thickness tM and the silicon thin film 6 of the film thickness tSi are deposited alternately by a necessary number of layers (N layers). The number of layers (considering a pair of the metal thin film and the silicon thin film as one layer) necessary for depositing becomes an integer which satisfies $$N = TM/tMSi$$

when the film thickness of the metal silicide thin film to be obtained in the end is tM. However, tMSi is adjusted so that N becomes an integer at a film thickness not higher than the critical film thickness to be prescribed by a fail event.

The film thickness of the top layer is set to be 1/2 tSi or 1/2 tM. The reason for the film thickness of the bottom layer and the top layer becoming 1/2 is as follows. Since a chemical reaction starts from the interface of different kinds of materials, the chemical reaction progresses from both sides of the upper interface and the lower interface for both the silicon thin film 6 and the metal thin film 20.

Accordingly, about the half film thickness of each film is consumed by a reaction from the upper interface and the lower interface. In other words, only one side of a reaction interface exists in the top layer film or the bottom layer film so that the necessary film thickness becomes 1/2.

Although the material of the top layer is a silicon thin film which is the same as the bottom layer according to the present embodiment, this need not be a silicon thin film but a metal thin film may also be good. Further, the film of the bottom layer need not be a silicon thin film but the depositing may be started from a metal thin film. Further, the method of depositing each film is not particularly limited.

After completing the depositing of a predetermined number of layers, the whole substrate is heated to a temperature sufficient enough to progress the silicide reaction and then the silicide reaction is completed. An example of the observation of the crystal state of the film after completing the reaction is shown in FIG. 27. FIG. 27 is an example of the observation, by using a transmission electron microscope, of the crystal structure of a film of laminated layers after a thermal annealing of the film at a temperature not lower than the temperature at which a silicide reaction is completed (for example 700° C.) by using a cobalt (Co) thin film as the metal thin film and setting the ratio of the atomic weight as Co:Si=2:1. A layer i shows a bonding agent for a sample of the transmission electron microscope, a layer ii shows a cobalt silicon alloy laminated film ($Co_2Si$) made of about 10 layers in the picture of FIG. 27, a layer iii shows a silicon oxide film and a layer iv shows a silicon substrate. The layer ii shows a state of divided lamination but this is only a color tone difference for each crystal because of difference in crystal orientation.

In a state after the completion of the reaction, it is clear that films have been formed in a laminated structure in a thickness direction of which layer crystal grains linked in horizontal direction pierce in a film thickness direction. The thickness of each film corresponds to a silicide film thickness which is determined by 1/2 of the sum of the film thickness of the metal thin films and silicon thin films that were laminated before the reaction, that is:

$$tMSi = 1/2(tM + tSi)/z$$

As described above, when a silicide reaction is carried out after laminating metal thin films and silicon thin films in a plurality of layers, it is possible to obtain a silicide thin film of a predetermined film thickness in a small crystal grain size, that is, in a low stress state in which a fail event does not occur, or stress due to a change in volume during progressing of a silicide reaction.

Figure 28:
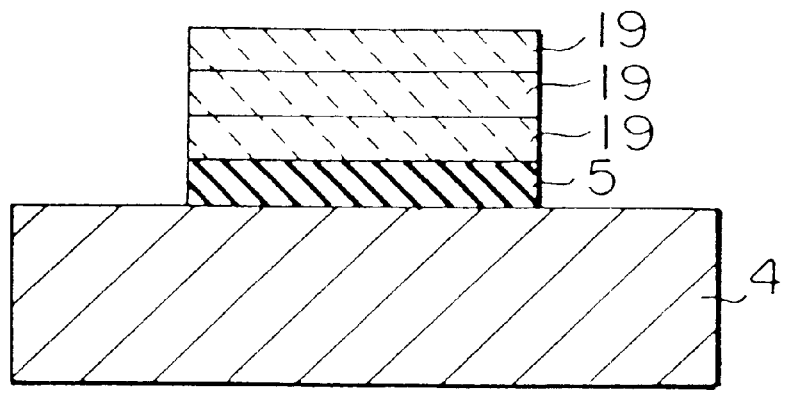
FIG. 28 is a schematic cross sectional view for showing a manufacturing process of a laminated layer structure of conductive thin films utilizing a metal silicide layer of a semiconductor device according to the present invention.

FIG. 28 shows a cross section of a MOS (metal-oxide-semiconductor) transistor manufactured by applying the present manufacturing method, which shows a state that a silicide alloy has been used for a gate electrode of the transistor.

According to the present embodiment, a gate electrode of a predetermined film thickness is formed by a laminated film made of small crystal grains so that the stress at the time of manufacturing a silicide film can be controlled to be not higher than the stress at the time of an occurrence of a fail event.

Figure 29:
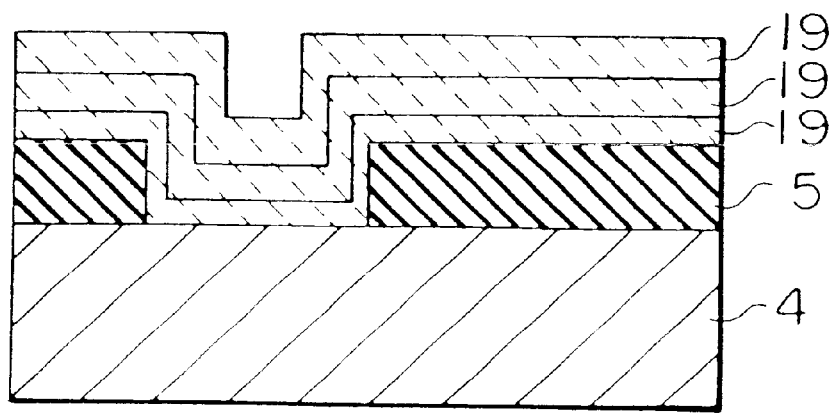
FIG. 29 is a schematic cross sectional view for showing a manufacturing process of a laminated layer structure of conductive thin films utilizing a metal silicide layer of a semiconductor device according to the present invention.

FIG. 29 shows a cross section of a semiconductor device that has been manufactured by using silicide thin films 19 as a wiring material according to the present manufacturing method. In the present embodiment, it is also possible to structure a wiring film of a predetermined film thickness by a laminated film of small crystal grains so that the wiring film can be manufactured in the state of a small stress in which a fail event does not occur.

As a metal suitable for forming a metal silicide thin film, one of the following can be selected: titanium Ti, vanadium V, chromium Cr, manganese Mn, iron Fe, cobalt Co, nickel Ni, tantalum Ta, tungsten W, zirconium Zr, niobium Nb, molybdenum Mo, palladium Pd, rhodium Rh, iridium Ir, platinum Pt, hafnium Hf, terbium Tb, erbium Er and yttrium Y.

Thin films in the present invention are to be applied for an optical device, an optical disk, a magnetic disk, interconnection in a superconductive device, etc.

One embodiment of the manufacturing device according to the present invention will be explained with reference to FIGS. 30, 31, 32, 33 and 34.

Figure 30:
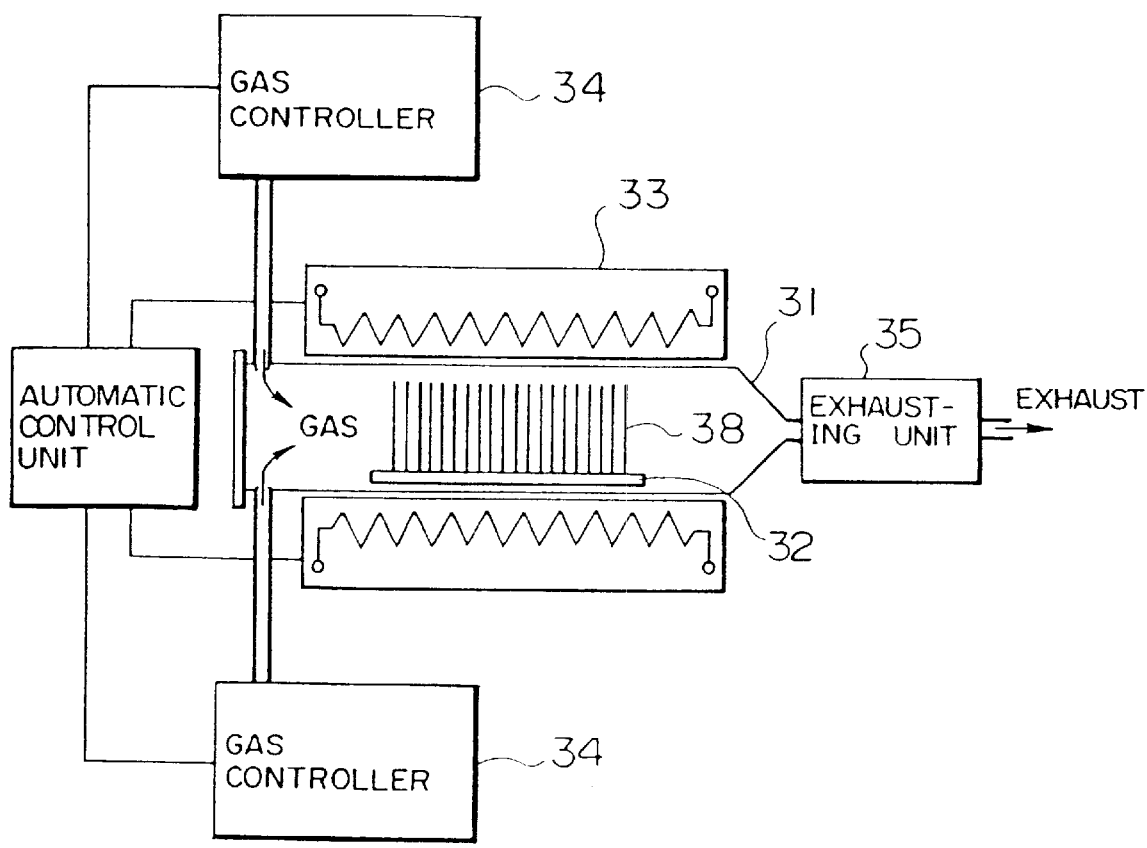
FIG. 30 is a drawing for showing a schematic structure of a manufacturing device for manufacturing a semiconductor device according to the present invention.
Figure 31:
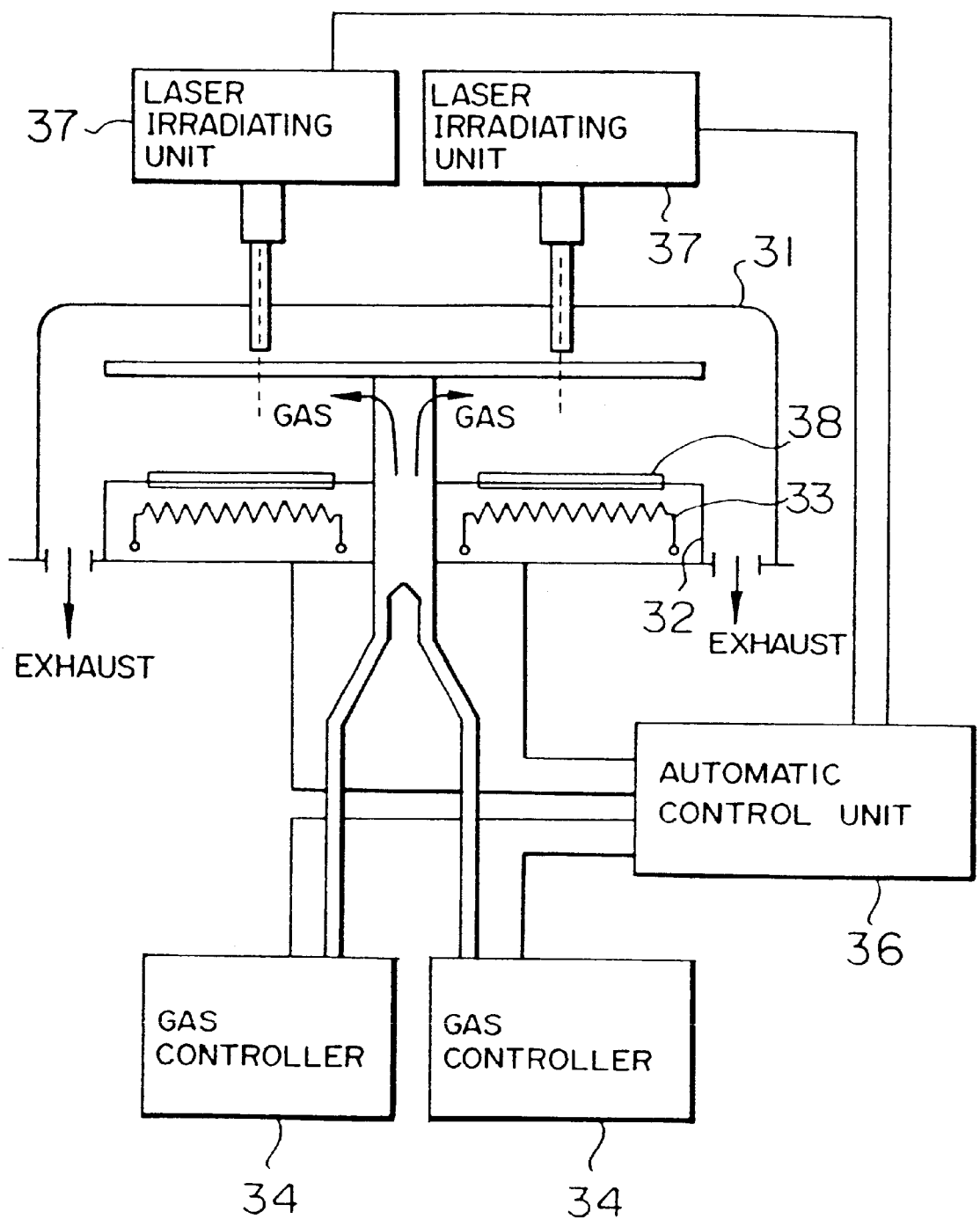
FIG. 31 is a drawing for showing a schematic structure of a manufacturing device for manufacturing a semiconductor device in another embodiment according to the present invention.

FIGS. 30 and 31 show one embodiment of the manufacturing device using a chemical vapor deposition based on the present invention. FIG. 30 shows an example of a diffusion furnace type manufacturing device and FIG. 31 shows an example of a vertical manufacturing device.

The manufacturing device according to the present invention is characterized in a control unit for automatically controlling a repetitive process of a combination of a plurality of processes including a process of depositing a film of an amorphous thin film and a process of crystallizing this thin film, and the manufacturing device may also be a lateral type or others.

The manufacturing devices shown in FIGS. 30 and 31 are structured by a chamber 31 for providing a place for a film forming process and a process for crystallizing amorphous materials on a semiconductor substrate 38, a tool 32 for supporting the semiconductor substrate 38, a heating unit 33 for adjusting the temperature of the semiconductor substrate and the atmosphere inside the chamber 31, a plurality of gas controllers 34 for supplying raw material gases, an exhausting unit 35 for controlling the pressure inside the chamber and exhausting air inside the chamber, and an automatic control unit 36 for automatically controlling the manufacturing method based on the present embodiment with a single unit for manufacturing the semiconductor device.

The automatic control unit 36 controls the heating unit 33, the plurality of gas controllers 34, the exhausting unit 35 and film forming conditions such as the temperature of the semiconductor substrate and the pressure inside the chamber. A laser irradiation unit 37 as shown in FIG. 31 may also be installed to selectively apply a laser beam to the whole or a part of the semiconductor substrate 38.

Figure 32:
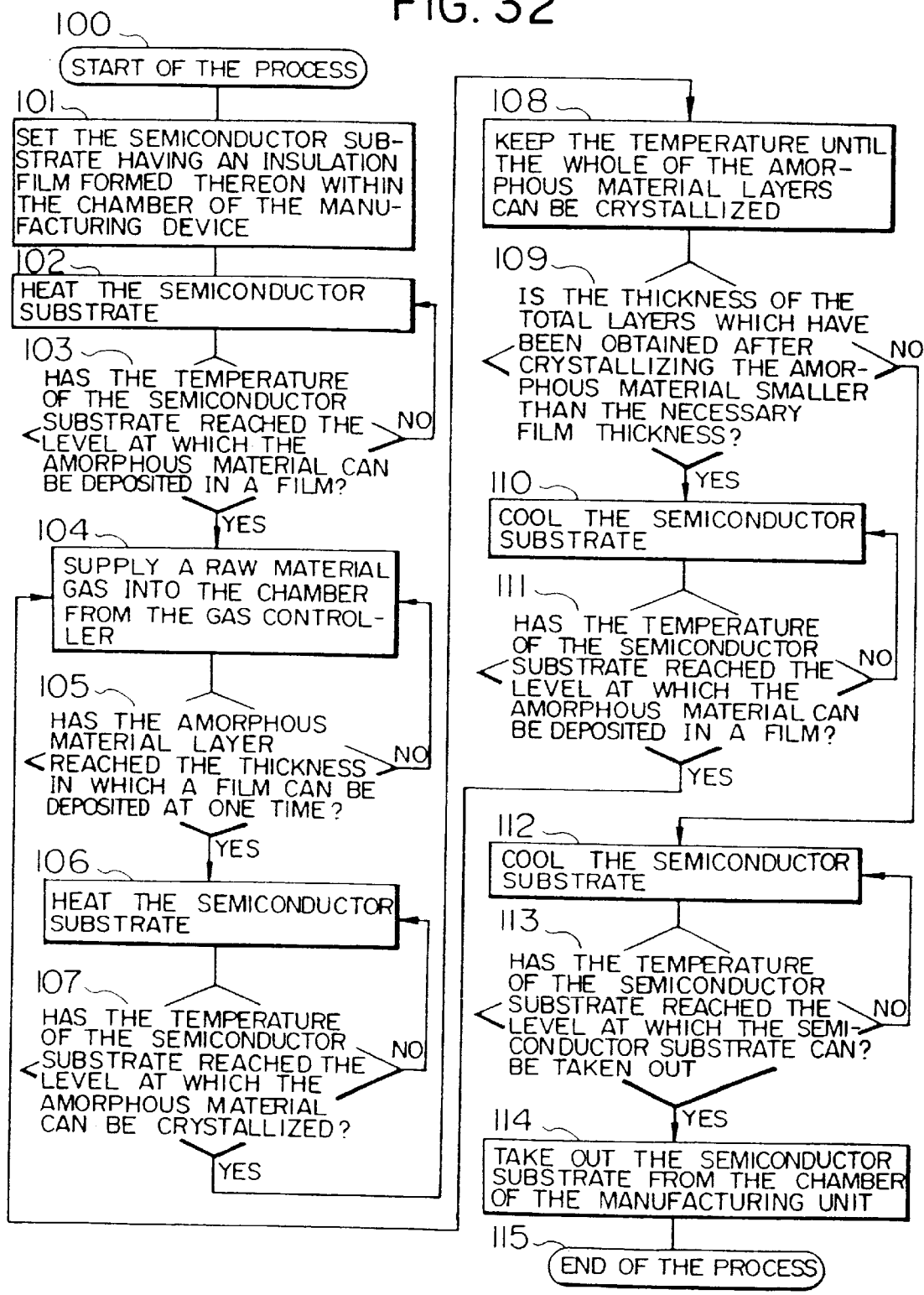
FIG. 32 is a flow chart for controlling the manufacturing devices shown in FIGS. 30 and 31.
Figure 33:
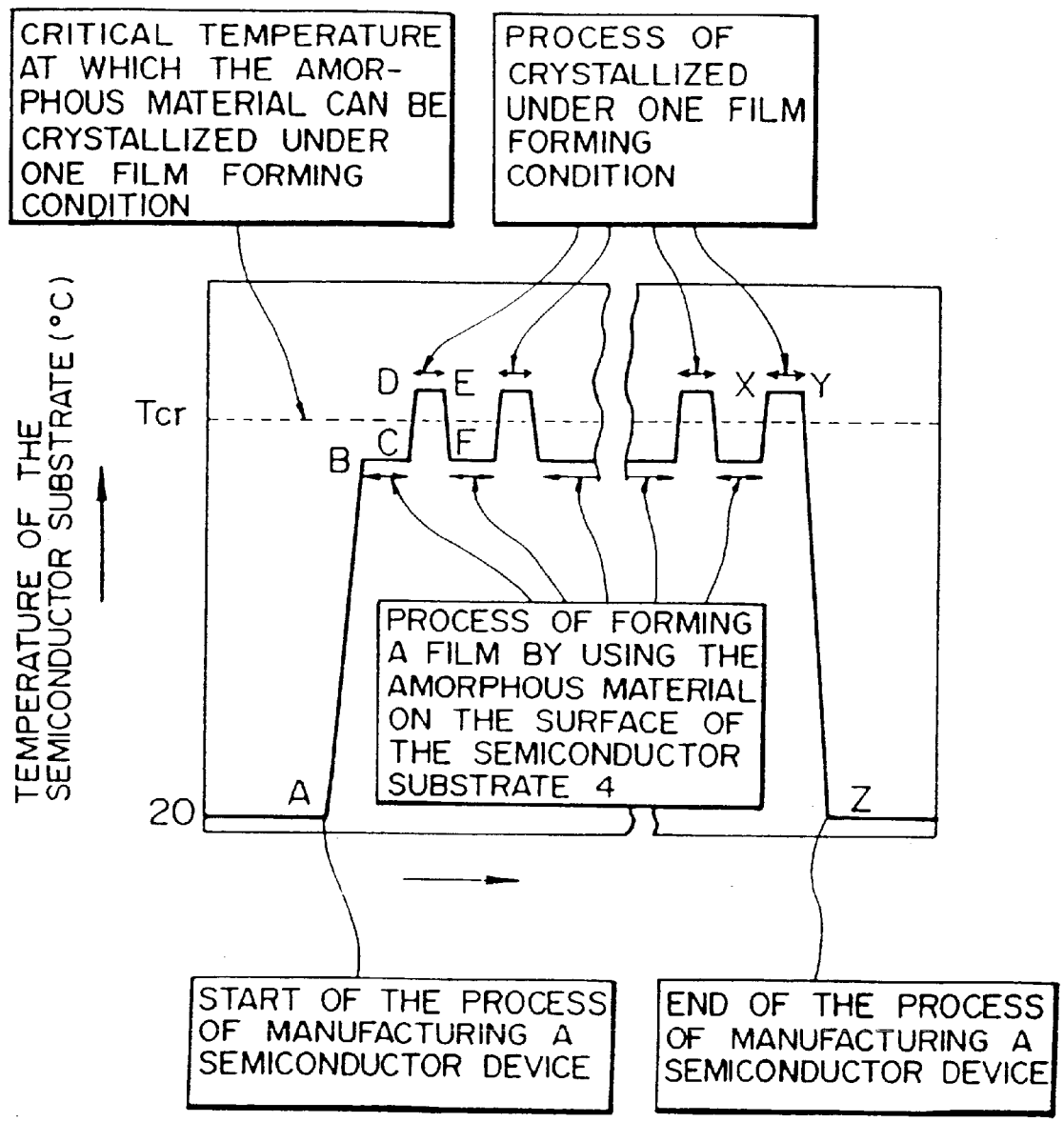
FIG. 33 is a drawing for explaining one example of controlling a temperature of a semiconductor substrate in the process of manufacturing a semiconductor device.

FIG. 32 shows one example of a flow chart of the operation of the automatic control unit 36 in the unit for manufacturing a semiconductor device shown in FIGS. 30 and 31. This flow chart is for the automatic control of the processes of the first embodiment shown in FIG. 14. FIG. 33 shows one example of the temperature process for automatically controlling the temperature of the semiconductor substrate and the temperature of the atmosphere inside the chamber as the conditions for forming films, based on the flow chart shown in FIG. 32. In FIG. 33, the horizontal axis shows time and the vertical axis shows the temperature of the semiconductor substrate, and $T_{cr}$ shows a critical temperature at which the amorphous material to be deposited on the semiconductor substrate 38 is crystallized.

The flow chart of FIG. 32 will be explained below. In FIG. 32, □ shows a processing and ◇ shows a decision. Assume that the temperature at the time of starting the process is 20° C., for example. The control of this manufacturing process of the semiconductor device starts from (100) of FIG. 32. In processing (101), the semiconductor substrate 38, on which an insulation film such as a silicon oxide film or the like has been formed by the sixth process shown in FIG. 7, is installed within the chamber, which corresponds to A in FIG. 33. When inside the chamber has not yet reached a vacuum level which is suitable for the environment of depositing a film, air is exhausted by using a vacuum exhausting unit. In processing (102), the semiconductor substrate 38 is heated by using the heating unit 33 shown in FIG. 30 or FIG. 31. In decision (103), a decision is made whether the temperature of the semiconductor substrate has reached a temperature suitable for depositing an amorphous film. If the temperature suitable for depositing a film has not yet reached, or if a decision of No has been made in the decision (103), the process returns to the processing (102) and the heating of the semiconductor substrate is continued. The loop of the processing (102) and the decision (103) is repeated until the temperature of the semiconductor substrate reaches the temperature suitable for depositing the amorphous material film, that is, until a decision of Yes is made in the decision (103), which corresponds to the processes A to B in FIG. 33. If the decision (103) is controlled by the heating time, the heating is continued until a predetermined heating time has been reached.

After a decision of Yes has been made in the decision (103), processing (104) is carried out by maintaining the temperature suitable for depositing a film. In the processing (104), a supply of a raw material gas from the controller into the chamber and the control of the pressure of the raw material gas in the chamber are carried out. In this processing, a film formation of a first divided amorphous material layer is carried out by the chemical vapor deposition method or the like. In decision (105), a decision is made whether or not the thickness of a first divided amorphous material layer which is depositing in a film at one time has reached a predetermined value not larger than the thickness to be prescribed by a critical stress value determined according to a fail event. If the film thickness has not yet reached the predetermined value, or if a decision of No has been made in the decision (105), the processing returns to the processing (104), and the supply of the raw material gas into the chamber and the control of the pressure of the raw material gas in the chamber are continued. The loop of the processing (104) and the decision (105) is repeated until the thickness of the first divided amorphous material layer reaches the predetermined thickness, or until a decision of Yes has been made in the decision (105), which corresponds to the processes of B to C in FIG. 33. However, if the decision (105) is controlled by a film forming time, the processing (104) is continued until a predetermined film depositing time has been reached.

When the thickness of the film deposited has reached a predetermined value not larger than a predetermined thickness to be prescribed by a critical stress value determined according to a fail event, a decision of Yes is made in the decision (105), and the supply of the raw material gas is stopped. Then the processing moves to processing (106). In the processing (106), the heating unit 33 shown in FIG. 30 or FIG. 31 continues to heat the semiconductor substrate 38 until the temperature reaches a level at which the amorphous material is crystallized. In decision (107), a decision is made whether or not the temperature of the semiconductor substrate has reached a temperature at which the amorphous material is crystallized. Similar to the loop of the processing (102) and the decision (103), the loop of the processing (106) and the decision (107) is also repeated until a decision of Yes has been made in the decision (107), which corresponds to the processes C to D in FIG. 33. However, if the decision (107) is controlled by the heating time, the heating is continued until a predetermined heating time has been reached.

At the time when the temperature of the semiconductor substrate has reached a temperature at which the amorphous material is crystallized, the next processing is started. In processing (108), the temperature is maintained at least for a period of time which is required to crystallize the whole of the first divided amorphous material layer, which corresponds to the processes D to E in FIG. 33.

After ending the processing (108), a decision is made in decision (109) whether or not the whole thickness of the crystallized layer of the amorphous material has reached a required design thickness. If the decision (109) is controlled by the number of depositing films of the amorphous material layers, a decision of Yes is made until a predetermined number has been reached. A decision of No is made when the predetermined number has been reached.

If the thickness of the total layers after the amorphous material has been crystallized does not reach the required design thickness, the film forming process by using the amorphous material and the crystallization process are repeated again, in a loop of processing (110) and decision (111) so that the semiconductor substrate is cooled until a temperature is reached at which the amorphous material can be formed in a film, which corresponds to the processes from E to F in FIG. 33.

At the time when the temperature of the semiconductor substrate has reached a level at which the amorphous material can be deposited in a film, the processing changes from the decision (111) to the processing (104). In the loop of the processing (104) and the decision (105), the raw material gas is supplied to the chamber and the pressure of the raw material gas inside the chamber is controlled while maintaining the temperature of the semiconductor substrate 38 at the above temperature level. Thus, a film deposited of a second divided amorphous material layer is started. Thereafter, the processings and the decisions from (104) to (111) are repeated until the film thickness of the total divided amorphous material layers has reached a required design thickness. If a decision of No has been made in the decision (109) in the repetition of the processings and the decisions (104) to (111), or when the thickness of the total layers of the crystallized amorphous material has reached a required design thickness, a loop of processing (112) and decision (113), which corresponds to Y to Z in FIG. 33, is started. In processing (112), the semiconductor substrate 38 is cooled at a cooling speed which does not cause a failure, due to a thermal stress or the like, in the semiconductor device in manufacturing. In the decision (113), a decision is made whether or not the temperature of the semiconductor substrate has reached a temperature for taking out the substrate, for example 20° C. temperature of the semiconductor substrate.

At the time when a decision has been made in the decision (113) that the temperature of the semiconductor substrate has reached a level for taking out the substrate, the processing changes to processing (114) and the semiconductor substrate 38 is taken out from the chamber of the manufacturing device. By finishing this process of taking out the substrate, all the processes controlled by the automatic control unit 36 using the manufacturing device based on the present embodiment is completed, which corresponds to Z in FIG. 33.

It is needless to mention that the temperature for starting the processes and the temperature for taking out the substrate does not need to be 20° C. and the temperature may be any desired level not higher than the crystallization temperature. Further, the temperature may also be not lower than the crystallization temperature, but in this case, the processing (102) in FIG. 32 is not heating the semiconductor substrate but cooling the semiconductor substrate and the processing (112) in FIG. 32 is heating the semiconductor substrate.

Figure 34:
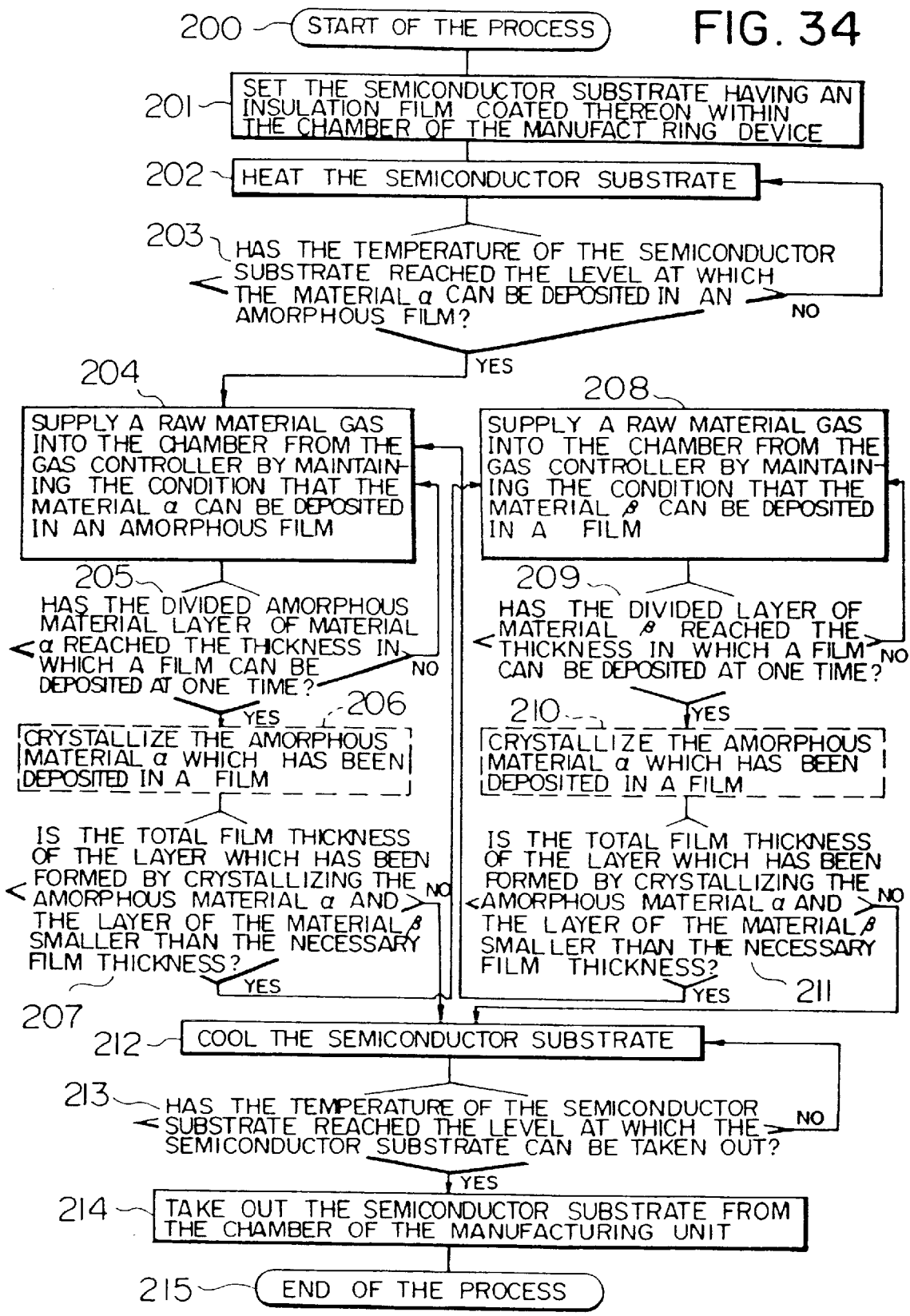
FIG. 34 is a flow chart for controlling the manufacturing devices shown in FIGS. 30 and 31.

FIG. 34 shows another example of a flow chart of the operation of the automatic control unit 36 in the unit for manufacturing a semiconductor device shown in FIGS. 30 and 31. This flow chart is for the automatic control of the processes of the second embodiment shown in FIG. 17. The flow chart of FIG. 34 is the flow chart of FIG. 32 combined with a process of forming a film of other material layers for dividing the amorphous material layers.

Description will be made according to the flow chart of FIG. 34. Processing of □ displayed in a dotted line in the drawing is a process which is not necessarily carried out but is carried out when necessary, of which detail s will be explained later. Assume that the temperature for starting the processes is 20° C., for example. The control of the manufacturing process of the semiconductor device is started from (200) in FIG. 34.

Processings and decisions (201) to (205) are the same as the processings and decisions (101) to (105) in FIG. 32. These processes cover the processes up to the process of depositing a film of an amorphous material α. The next process (206) may or may not be carried out at this stage. In decision (207), a decision is made whether or not a total film thickness of a layer which has been obtained by crystallizing the amorphous material α and a layer of a material β which is different from α is smaller than a design film thickness. If there is a layer in which the amorphous material α has not yet been crystallized, a decision is made whether or not the total film thickness of the α and β layers is smaller than a design film thickness when the layer has been crystallized.

In next processing (208), the temperature of the semiconductor substrate is set under a condition that the material β can be deposited in a film, and by maintaining this environment, the raw material gas of the material β is supplied to deposit a film of the β layer. In depositing a film of the β layer, a raw material gas is supplied as described above when the chemical vapor deposition method or the like is utilized to form the film. However, when a film is to be deposited by the sputtering method or the like, instead of the material gas, a gas for colliding an ion against a target by accelerating the ion, such as an argon gas, is supplied. The β layer may be deposited in a film in an amorphous state or in a crystal state. In decision (209), a decision is made whether the β layer has reached a thickness to be deposited in a film in one time or not. The loop of the processing (208) and the decision (209) is repeated until this film thickness is reached. Next processing (210) may or may not be carried out at this stage.

In processing (211), similar to the decision (207), a decision is made whether or not a total film thickness of a layer which has been obtained by crystallizing the amorphous material α and a layer of a material β which is different from α is smaller than a design film thickness. If there is a layer in which the amorphous material α has not yet been crystallized, a decision is made whether or not the total film thickness of the α and β layers is smaller than a design film thickness when the layer has been crystallized.

In the decision (211), if a decision of No has been made, or if a decision has been made that the total film thickness of the α and β layers has reached a design value, and if all the crystallization of the amorphous material has been finished, the processing proceeds to next processing (212). When a decision of No has been made in the decision (211) and if there is still a layer which has not yet been crystallized, crystallization of the layer which has not yet been crystallized is carried out before going to the next processing (212). In other words, the processing (206) and the processing (210) do not need to be carried out each time since the layer of the amorphous material α is deposited by dividing the other material β layer. However, in order to proceed to the processing (212) by crystallizing all the amorphous material, there must be provided a process for crystallizing at least one time at any of the time of the last processing (206) before moving to the processing (212), the time of the last processing (210) before moving to the processing (212) or immediately before the processing (212).

The above-described process of crystallizing the amorphous material may be carried out each time after the film formation process of each divided amorphous material layer, or the divided amorphous material layer may be locally crystallized by a laser irradiation, or the crystallization may be carried out after finishing the whole film forming process due to a reason of shortening of the manufacturing process, as shown in the second embodiment.

The subsequent processes of the processing (212), processing (213) and processing (214) are the same as the processes of the processing (112), the processing (113) and the processing (114). In other words, the semiconductor substrate is cooled until the temperature has reached a level for taking out the substrate, for example 20° C., and the semiconductor substrate is taken out from the chamber of the manufacturing device, so that the whole processes controlled by the automatic control unit 36 which uses the manufacturing device based on the present embodiment is finished.

It is needless to mention that the temperature for starting the processes and the temperature for taking out the substrate does not need to be 20° C. and the temperature may be any desired level not higher than the crystallization temperature. Further, the temperature may also be not lower than the crystallization temperature, but in this case, the processing (202) in FIG. 34 is not heating the semiconductor substrate but cooling the semiconductor substrate and the processing (212) in FIG. 34 is heating the semiconductor substrate.

As described above, when the unit for manufacturing a semiconductor device is utilized, it is possible to manufacture a semiconductor device having a low stress structure, explained in the first embodiment, the second embodiment and the third embodiment, in the same chamber in a consistent process by an automatic control. Therefore, a semiconductor device in manufacturing can be effectively controlled without exposing the semiconductor device to the atmosphere.

Figure 35:
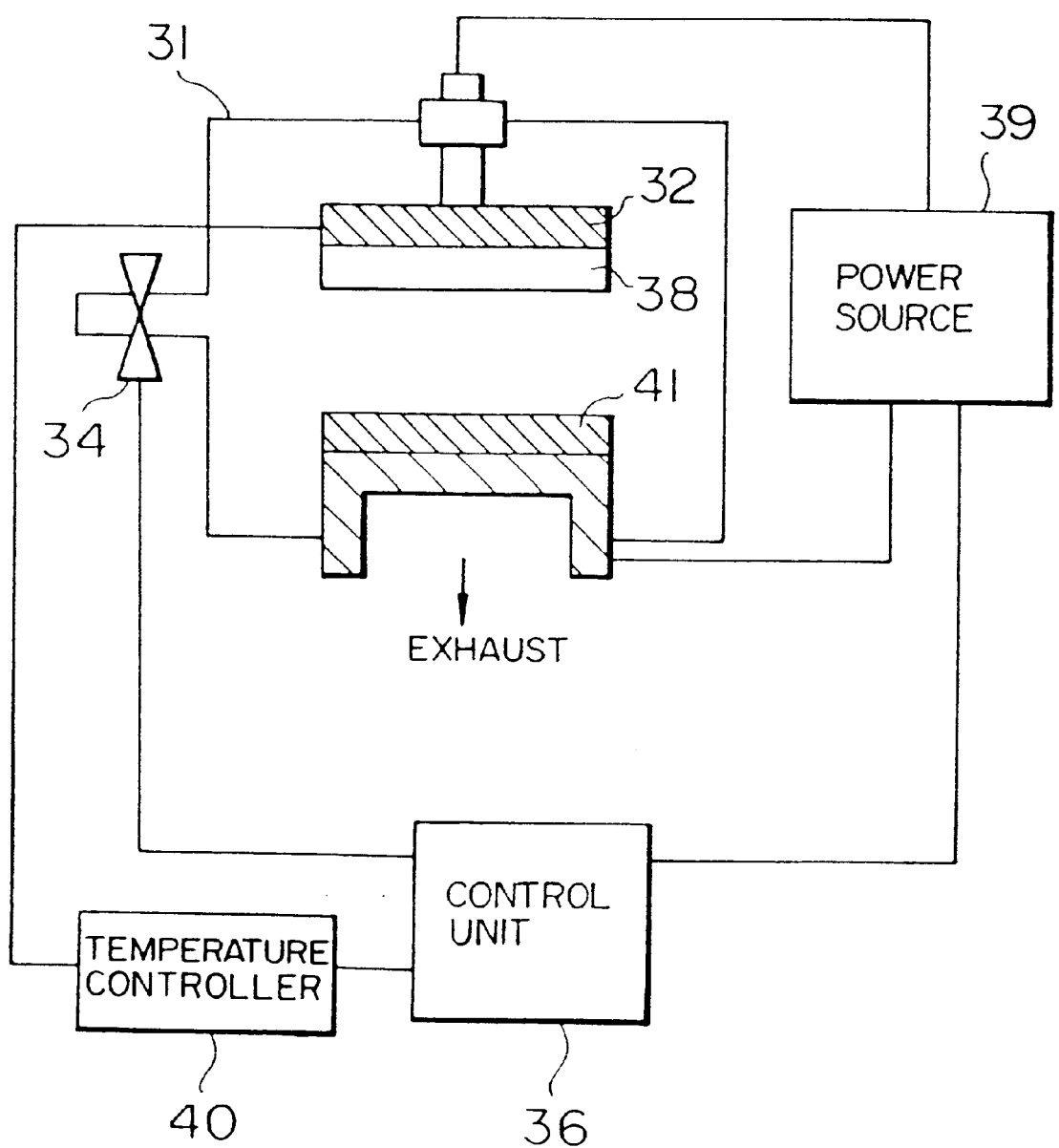
FIG. 35 is a drawing for showing a schematic configuration of a manufacturing device utilizing a sputtering method for manufacturing a semiconductor device in another embodiment according to the present invention.
Figure 36:
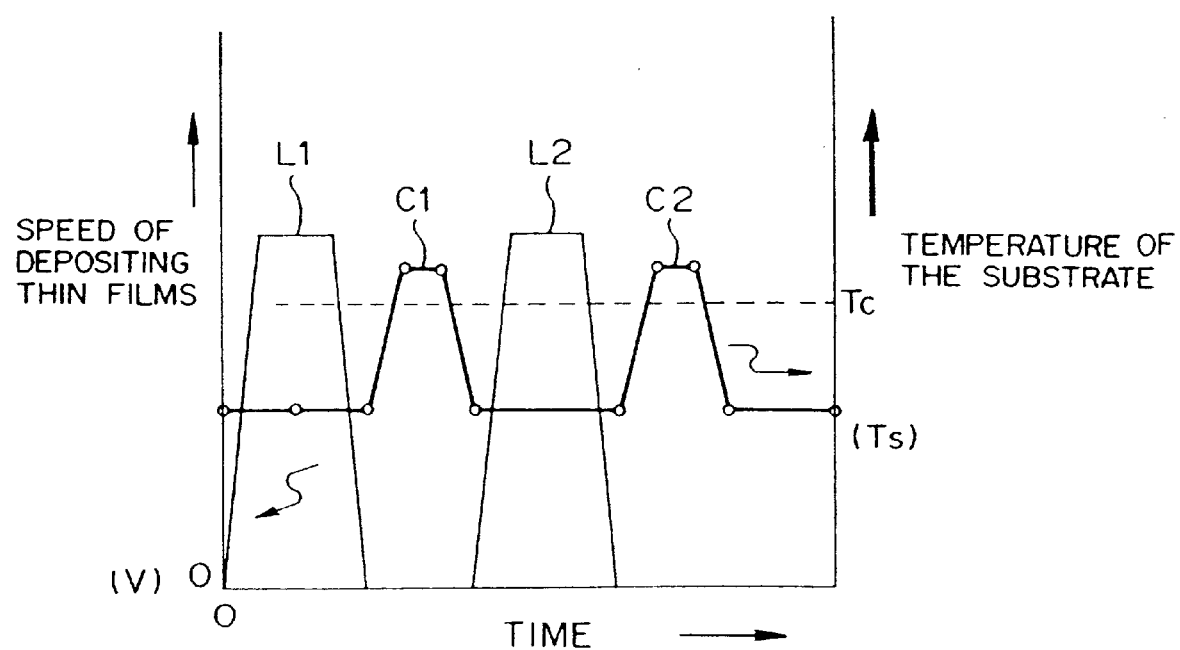
FIG. 36 is a graph for showing one example of controlling a temperature of a semiconductor substrate and a speed of depositing thin films in the process of manufacturing a semiconductor device shown in FIG. 35.

Next, an embodiment relating to the manufacturing device of the present invention will be explained with reference to FIGS. 35 and 36. FIG. 35 is a cross sectional configuration diagram of a bipolar sputtering unit when the sputtering method is employed as a method of forming a thin film. A material target 41 for forming film and a substrate 38 for depositing a film face each other, and a DC or AC voltage is applied between the target 41 and the substrate 38 from a power source 39 and a discharging gas, for example an Ar gas, introduced through a gas controller 34 is discharged.

The substrate 38 is held by a holder 32 having a heating function and the temperature of the holder 32 is controlled by a temperature controller 40. A speed of depositing a thin film is adjusted by controlling the pressure of an introduced gas, an applied voltage or the temperature of the substrate by a control unit 36. The temperatures of the substrate 38 and the holder 32 are also controlled by the control unit 36.

The method of controlling the speed for depositing a thin film and the temperature of the substrate will be explained with reference to FIG. 36. FIG. 36 shows an example of time controlling a speed V for depositing a thin film and a temperature Ts of the substrate. At the time of starting the depositing of a thin film, the temperature of the substrate is held at a sufficiently lower level than the temperature of crystallization.

In this state of the temperature, a first layer film is deposited within a predetermined film thickness range prescribed by a fail event (L1). Then, the depositing of a thin film is stopped and a crystallization reaction of a film that has been deposited by increasing the substrate temperature Ts to a crystallization temperature Tc or above is completed (C1). The temperature control is carried out so that the crystallization is within the range of the primary recrystallization reaction, that is, the crystallization is carried out so that a film thickness is obtained by a deposition of grown grains of average grain size.

After completing the crystallization reaction, the substrate temperature Ts is lowered to be not higher than the crystallization temperature Tc and the film deposition is started again. When the thickness of the deposited films has reached a predetermined thickness, the deposition of films is stopped and the substrate temperature Ts is increased to crystallize a second layer deposited film (C2). The deposition of thin films can be stopped by stopping an application of a discharge voltage, or by dropping the discharge voltage to not higher than a discharge critical voltage, or by stopping an introduction of a discharge gas or by controlling a gas pressure to outside the discharging area. The heating of the substrate can be achieved by keeping a heater or the like in the holder 32.

It is needless to mention that although films are deposited two times in the present embodiment, that is L1 and L2, the number of depositing films is not limited to two times but the film deposition may be carried out by a required number of times.

According to the present embodiment, in a manufacturing device for depositing thin films of a predetermined film thickness, it is possible to provide the unit which can continuously carry out depositing of films by a plurality of times of which film thickness is not larger than a maximum film thickness to be prescribed by a fail event and crystallization of each deposited film, without taking out the substrate from the unit. Therefore, there is an effect that it is possible to provide a manufacturing device which can deposit thin films of a predetermined film thickness of a low stress without an occurrence of a fail event.

Figure 37:
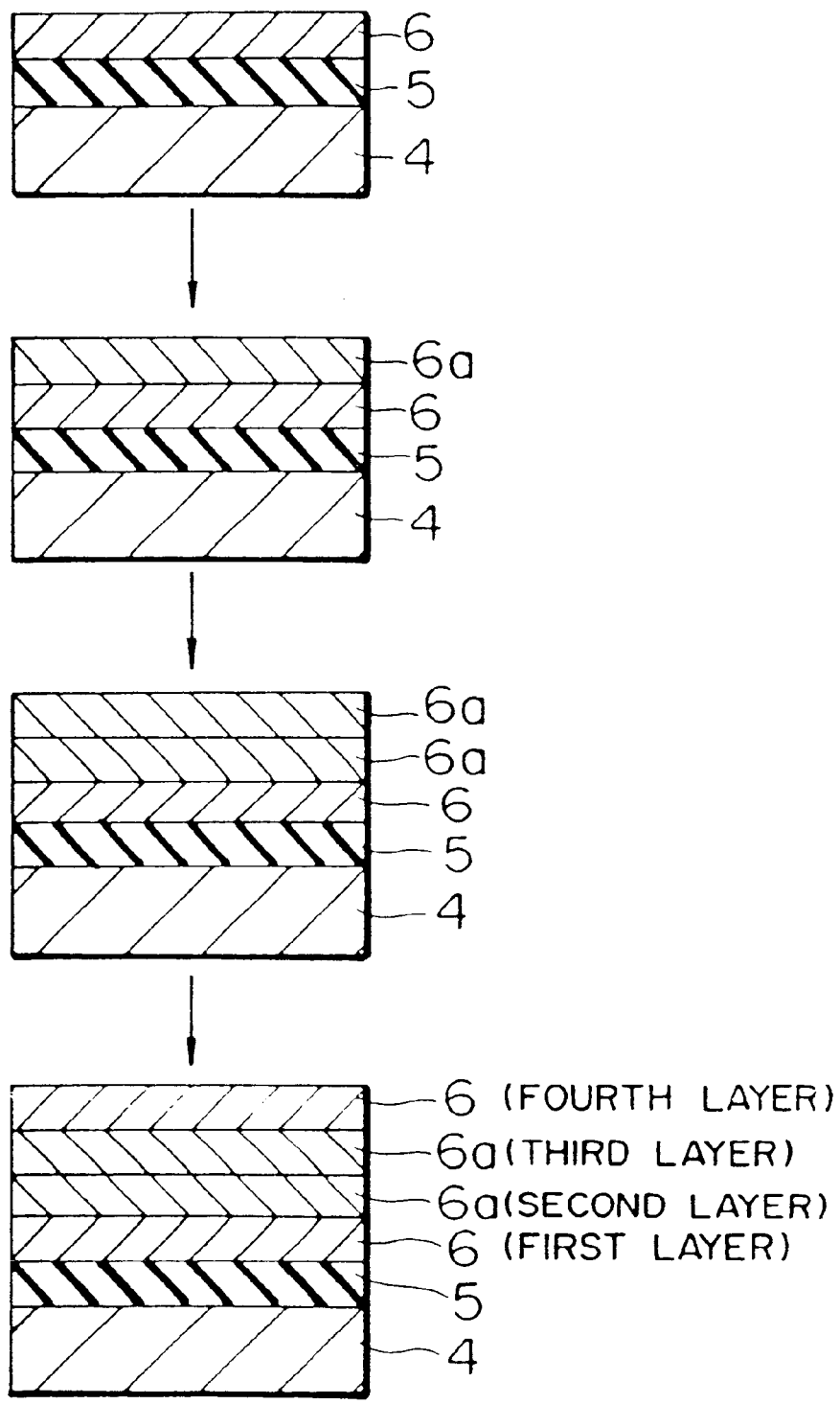
FIG. 37 is a drawing for showing another embodiment for manufacturing a laminated thin film structure of a semiconductor device according to the present invention.

Another embodiment of the method of manufacturing thin films of the present invention will be explained with reference to FIGS. 37, 38, 39 and 40. FIG. 37 shows a method of manufacturing a laminated thin film structure unit according to the present embodiment.

On the surface of a silicon substrate 4, a base film, that is a silicon oxide film, is formed, and amorphous thin films into which an impurity of a predetermined density has been doped, such as for example amorphous silicon thin films, are deposited within a range of a film thickness which does not cause an occurrence of fail event, and then the crystallization reaction of the deposited thin films is completed.

Into a second layer amorphous silicon thin film, an impurity is doped having a density higher than the density of the first layer and then the crystallization reaction of the film is completed. The density of a third layer film is set to be the same as the density of the second layer film, and an impurity of the density same as the density in the first layer film is doped in a fourth layer. Then the crystallization reaction of the respective layers is completed.

According to the present embodiment, a polycrystalline silicon thin film of a predetermined film thickness can be obtained as a laminated thin film structure of small grain size, so that the film can be deposited in a low stress state and a gradient of an impurity density can be deposited in a film thickness direction. The number of the film layers to be laminated does not need to be four as described in the present embodiment.

Figure 38:
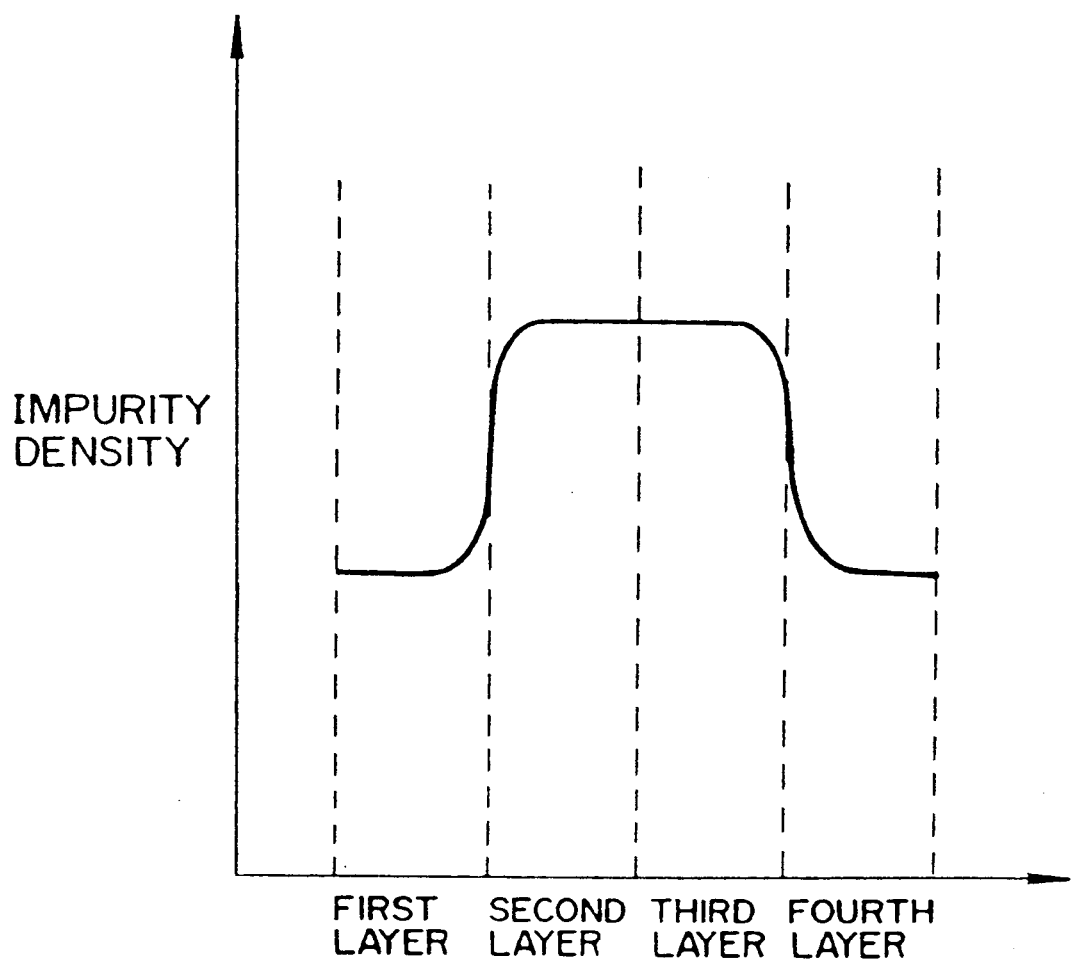
FIG. 38 is a graph for showing one example of controlling a density of an impurity in each laminated film in the manufacturing process shown in FIG. 37.

It is also needless to mention that the profile of the impurities to be doped in the layers does not need to be the profile as shown in FIG. 38 but any desired profile can be formed to meet an object.

Figure 39:
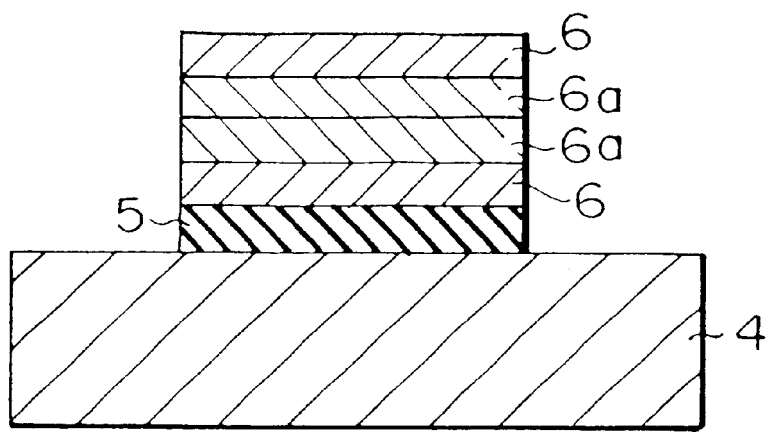
FIG. 39 is a drawing for showing another embodiment for manufacturing a laminated thin film structure of a semiconductor device according to the present invention.

FIG. 39 is a cross section of a MOS transistor that has been manufactured by applying the method of manufacturing a thin film according to the present embodiment. It is also good to consider a case of using P as an impurity to reduce an electric resistance. In this case, the density of P in the first layer is controlled to be low as shown in FIG. 38 in order to minimize an occurrence of a deterioration of an oxide film due to a diffusion of P in the oxide film.

According to the present embodiment, there is an effect that a low stress can be obtained by having a polycrystalline silicon thin film, which becomes a gate electrode, as a laminated film structure of which crystal grain size is small. Also, there is an effect that the profile of an impurity density in a film thickness direction can be controlled to meet an object. It is needless to mention that the number of deposited layers for the gate electrode film is not limited to four as shown in the present embodiment. The profile impurity may also be different from the one shown in FIG. 38.

Figure 40:
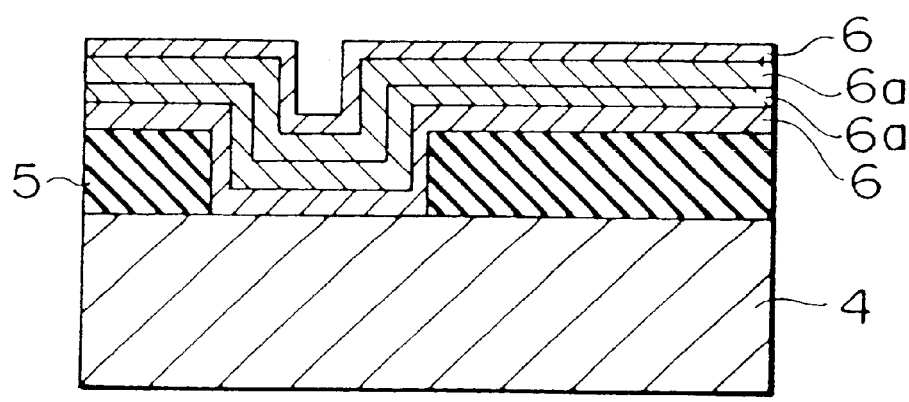
FIG. 40 is a drawing for showing an embodiment for manufacturing a wiring film by a laminated thin film structure of a semiconductor device according to the present invention.

FIG. 40 shows an example of the cross section of a wiring thin film structure for a semiconductor device for which the method of manufacturing a thin film according to the present embodiment has been applied for the manufacture of the wiring film. Consider a profile of impurity as shown in FIG. 38, for example. Electric resistance of second and third layers whose density is high is lower than the electric resistance of first and fourth layers so that a current selectively flows through the second and third layers.

In this case, Joule heat is generated mainly in these two layers so that the temperature of the first and fourth layers becomes relatively low and surface diffusion of atoms ruling the electromigration is restricted, with a result that electromigration-proof life may be improved.

In the present embodiment, the number of deposited layers of films in the film thickness direction is not limited to four and the profile of impurity density may also be different from the one shown in FIG. 38. In the present embodiment, a thin film whose profile of impurity density in the film thickness direction has been controlled to meet a predetermined object can be obtained as a laminated film structure of fine grain size. Therefore, there is an effect that a thin film structure can be provided in a low stress state which does not cause an occurrence of a fail event.

Figure 41:
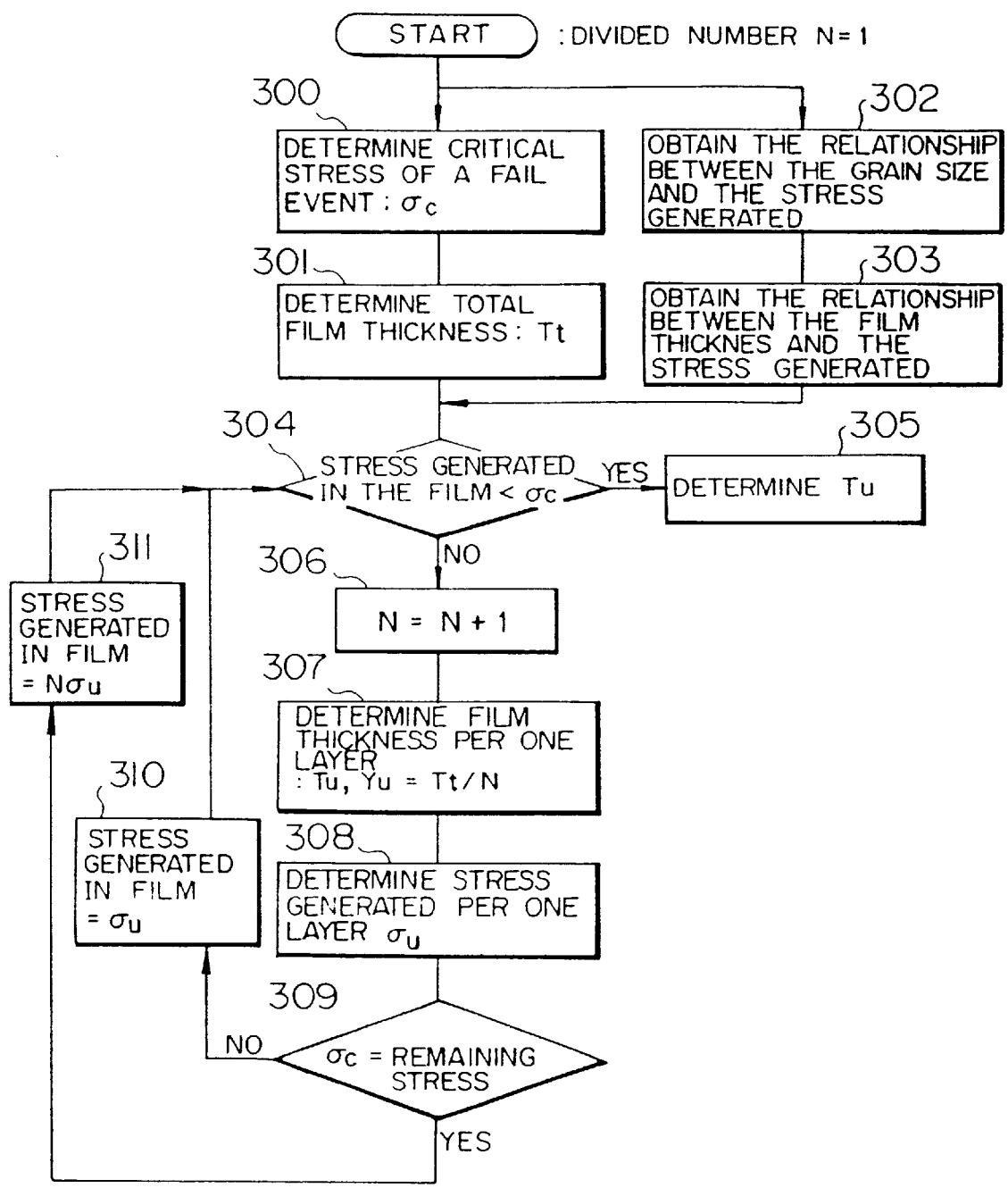
FIG. 41 is a flow chart for showing a method of determining a film thickness of each laminated thin film structure according to the present invention.

An embodiment of a method of determining a film thickness according to the present invention will be explained with reference to FIGS. 41, 42 and 43. FIG. 41 shows a flow chart of the method of determining a film thickness according to the present invention. An initial value of a film divided number N is set as 1.

A critical stress exists in each of a mechanical fail event caused by a stress of a film, such as a peeling off or crack of a film, or in an occurrence of a dislocation in a monocrystalline substrate. Thus, in processing (300), a critical stress $\sigma_c$ corresponding to a mechanical fail event which occurs in an object process is determined. In processing (301), a necessary total film thickness $T_t$ is determined based on a cross sectional area of a wiring or the like which satisfies a necessary design resistance value or based on a surface area or the like which satisfies a capacitance value or the like.

Figure 42:
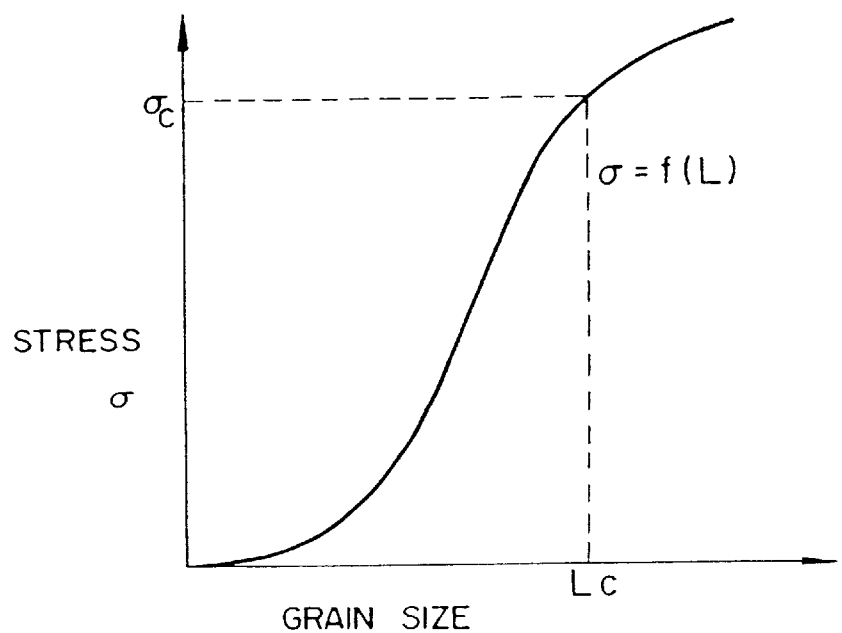
FIG. 42 is a graph for showing a relationship between a crystal grain size and a stress generated, to be utilized in the method of determining a film thickness according to the present invention.
Figure 43:
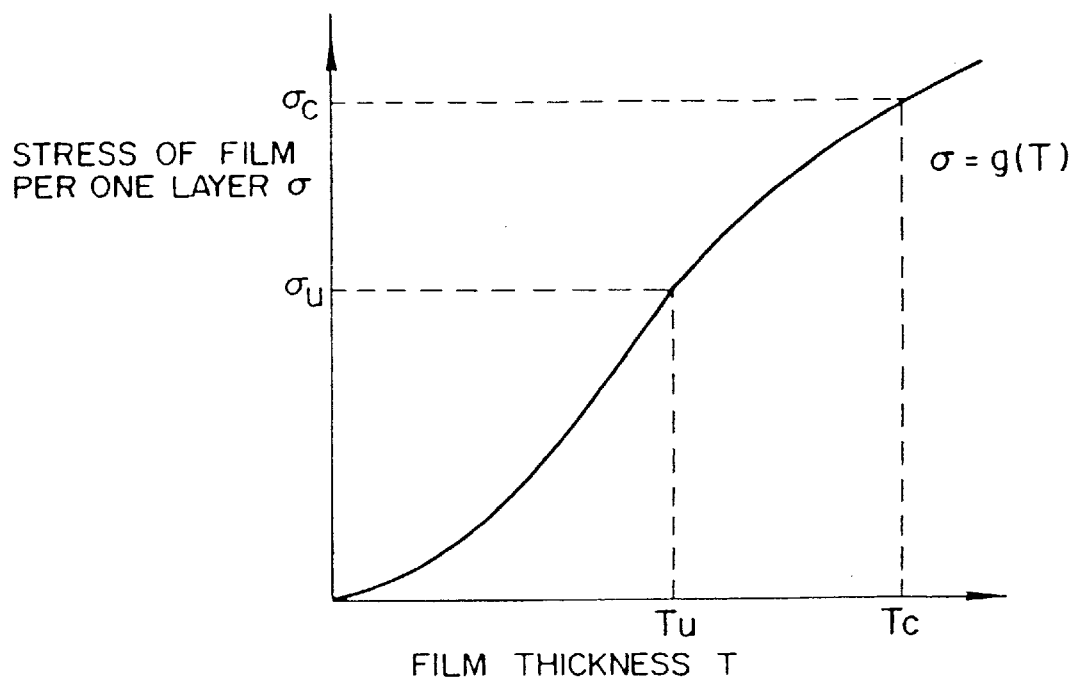
FIG. 43 is a graph for showing a relationship between a film thickness and a stress generated, to be utilized in the method of determining a film thickness according to the present invention.

In a crystallization reaction or a silicide reaction, there is a correlation between a crystal grain size $L_c$ after the completion of a reaction and a stress $\sigma$ generated by a film, as shown in FIG. 42. A function which shows the relation between the two is the function of a crystal grain size before or after the reaction and Young's modulus of the film, etc. In process (302), the relationship between the grain size and the film stress, that is, $\sigma = f(L)$ is obtained. Since a critical stress $\sigma_c$ exists in each of a mechanical fail event caused by a stress of a film, such as a peeling off or crack of a film, or in an occurrence of a dislocation in a monocrystalline substrate, the critical crystal grain size $L_c$ is determined according to each fail event.

In general, it has been known that when a primary recrystallization reaction has been generated in a thin film by thermal annealing, a crystal grain size becomes about a film thickness as a result. Accordingly, considering this primary recrystallization reaction, a relationship between the film thickness and the generated stress can be known as shown in FIG. 43. In processing (303), the relationship between the film thickness and the generated stress, that is $\sigma = g(T)$ is obtained. It is also possible to obtain a critical film thickness $T_c$ corresponding to the critical stress $\sigma_c$ of a mechanical fail event according to each fail event in a similar manner. Once a film thickness $T_u$ per one layer to be deposited has been determined, a stress $\sigma_u$ generated in the film per one layer, when a crystallization reaction or a silicide reaction has been generated one time to an amorphous material layer of the determined film thickness, can be readily read from FIG. 43. Therefore, it is possible to decide whether the generated stress $\sigma_u$ can cause a fail event to occur or not.

In decision (304), a decision is made whether the stress generated inside the film is not larger than the critical stress $\sigma_c$ or not. If the generated stress is not larger than the critical stress value of a fail event, that is, when a decision of Yes has been made in the decision (304), the film is deposited one time and the crystallization reaction is completed. In this case, the film thickness in one-time film formation, which is finally determined in processing (305), becomes $T_u = T_t$. However, if the generated stress is larger than the critical stress value at the time of an occurrence of a fail event, or when a decision of No has been made in the decision (304), a division of the film must be considered.

When a decision of No has been made in the decision (304), the processing proceeds to processing (306) and the number of times to divide a film is set as N=N+1. In processing (307), the number of divisions of a film N newly determined in the processing (306) is used to determine a film thickness $T_u$ per one layer to be $T_u = T_t/N$. In processing (308), the stress $\sigma_u$ generated within the film, when the amorphous material layer of the film thickness $T_u$ newly determined in the processing (307) has been crystallized, is obtained from the relationship between the film thickness and the generated stress, $\sigma = g(T)$, that has been obtained in the processing (303).

In processing (309), a decision is made whether a presence or an absence of an occurrence of a mechanical fail event is to be determined by a final remaining stress of the film. If a presence or an absence of an occurrence of a mechanical fail event is to be determined by a final remaining stress of the film, or when a decision of Yes is made in the processing (309), a stress generated in the film is set as $N\sigma_u$ in processing (311), and the loop of the decisions and processings (304) to (309) and (311) is repeated. A division is repeated until a condition, that is, a number of divisions, is obtained under which a sum $N\sigma_u$ of the stress generated within the film that has been divided into N layers does not exceed the critical stress value $\sigma_c$ of a fail event. If a presence or an absence of an occurrence of a fail event is not determined by the remaining stress of the film but a presence or an absence of an occurrence of a fail event is determined by a variation of the stress per one crystallization reaction or one silicide reaction, or when a decision of No is made in the processing (309), a stress generated in the film is set as No, in processing (310), and the loop of the decisions and processings (304) to (310) is repeated, and a condition, or a number of divisions, is obtained under which the stress $\sigma_u$ generated per one film thickness of the film that has been divided into N layers does not exceed the critical stress value $\sigma_c$ of a fail event.

The loop of the decisions and processings (304) to (309) and (311) or the loop of the decisions and processings (304) to (310) finishes at the time when a decision that the stress generated in the film is smaller than $\sigma_c$ has been made in the decision (304). Then, in the processing (305), a decision is made of the final film thickness $T_u$ per one layer. In this case, $T_u$ which has been determined in the last processing (307) is applied as it is for this $T_u$.

In either case, the film thickness of each of the divided film layers does not need to be constant but may be different. It is possible to determine an optimum film thickness of the film to be deposited at one time in the above-described method. Although not shown in FIG. 41, if a finite division number N can not be obtained or if the division number is not practical although a finite division number has been obtained, for example when N=10 or above, it is necessary to review the necessary number of film thickness $T_r$.

According to the present embodiment, there is an effect that it is possible to easily determine a film thickness to be deposited at one time when a thin film of a predetermined film thickness is deposited as a plurality of layers to obtain a laminated structure in a low stress state which does not cause an occurrence of a fail event.

As explained above, when the method of manufacturing a semiconductor device based on the present invention is used, the thickness of an amorphous layer to be deposited at one time is set to be not larger than a thickness to be prescribed by a critical stress value determined according to a fail event and the film is primary recrystallized so that it is possible to reduce a stress generated within the polycrystalline layer due to the crystallization. In the above embodiment, range of the optimum grain size is 10 nm to 5 $\mu$m, and range of the optimum film thickness is 10 nm to 1 $\mu$m.

Further, when thin films with reduced stress are piled to have a cross sectional area that does not cause an excess electric resistance, it is possible to finally obtain a semiconductor device which can prevent a failure due to a stress and which can prevent a deterioration of electric characteristics, an inter-layer peeling off or a crack within the layer, with a high reliability and in a high production yield.

Further, when the thin film manufacturing process according to the present invention is used, it is possible to control the whole processes of manufacturing a thin film by an automatic control unit which controls the process of depositing amorphous layers and the process of crystallizing the amorphous material, so that the thin film can be manufactured by an integrated process without exposing the thin film in manufacturing to the atmosphere.

Further, by using a method of the present invention for obtaining a thickness of an amorphous layer deposited at one time to be determined according to a fail event, it is possible to determine a film thickness of an amorphous layer that can be deposited at one time to obtain the above-described effect, which can securely prevent an occurrence of a fail event, instead of obtaining a film thickness of the amorphous layer based on experience.

What is claimed is:

1. A method of manufacturing a semiconductor device, comprising the steps of:
   providing a semiconductor substrate having polycrystalline silicon formed on a part of a surface of the semiconductor substrate;
   forming a first amorphous silicon in a region where said polycrystalline silicon is formed;
   crystallizing said first amorphous silicon to form a first polycrystalline silicon;
   after crystallizing said first amorphous silicon, forming a second amorphous silicon in contact with said first polycrystalline silicon; and
   crystallizing said second amorphous silicon to form a second polycrystalline silicon.

2. A method of manufacturing a semiconductor device according to claim 1, wherein said semiconductor substrate is formed of silicon.

3. A method of manufacturing a semiconductor device according to claim 1, wherein said first amorphous silicon and said second amorphous silicon are formed as films of amorphous silicon.

4. A method of manufacturing a semiconductor device according to claim 3, wherein film thicknesses of said first amorphous silicon and said second amorphous silicon range from 10 nm to 150 nm.

5. A method of manufacturing a semiconductor device according to claim 3, wherein film thicknesses of said first amorphous silicon and said second amorphous silicon range from 10 nm to 100 nm.

6. A method of manufacturing a semiconductor device according to claim 3, wherein film thicknesses of said first amorphous silicon and said second amorphous silicon range from 10 nm to 50 nm.

7. A method of manufacturing a semiconductor device, comprising the steps of:
   providing a semiconductor substrate having a conductive material formed on a part of a surface of the semiconductor substrate;
   forming a first amorphous material in a region where said conductive material is formed;
   crystallizing said first amorphous material to form a first polycrystalline material;
   forming a second amorphous material in contact with said first amorphous material; and
   crystallizing said second amorphous material to form a second polycrystalline material.

8. A method of manufacturing a semiconductor device according to claim 7, wherein said semiconductor substrate is formed of silicon.

9. A method of manufacturing a semiconductor device according to claim 7, wherein said conductive material is polycrystalline silicon.

10. A method of manufacturing a semiconductor device according to claim 7, wherein said first amorphous material and said second amorphous material are amorphous silicon.

11. A method of manufacturing a semiconductor device according to claim 7, wherein said first polycrystalline material and said second polycrystalline material are polycrystalline silicon.

12. A method of manufacturing a semiconductor device according to claim 8, wherein film thicknesses of said first amorphous silicon and said second amorphous silicon range from 10 nm to 150 nm.

13. A method of manufacturing a semiconductor device, comprising the steps of:

providing a semiconductor substrate having a conductive material formed on a part of a surface of the semiconductor substrate;

forming a first amorphous material for forming a first layer in a conductive material region where said conductive material is formed; and forming a second amorphous material for forming a second layer in a first amorphous material region where said first amorphous material is formed.

14. A method of manufacturing a semiconductor device according to claim 13, comprising the step of crystallizing said first amorphous material and said second amorphous material after the steps of forming a first amorphous material and forming a second amorphous material are completed.

15. A method of manufacturing a semiconductor device according to claim 13, wherein said first amorphous material and said second amorphous material are amorphous silicon.

16. A method of manufacturing a semiconductor device according to claim 1, including the further steps of patterning the first amorphous or polycrystalline silicon, and the second amorphous or polycrystalline silicon, such that after the patterning the second amorphous or polycrystalline silicon substantially covers the first amorphous or polycrystalline silicon.

17. A method of manufacturing a semiconductor device according to claim 1, wherein at least said first polycrystalline silicon and said second polycrystalline silicon together form a gate electrode of said semiconductor device.

18. A method of manufacturing a semiconductor device according to claim 1, comprising the further step of patterning the first amorphous or polycrystalline silicon such that the second amorphous or polycrystalline silicon covers patterned the first amorphous or polycrystalline silicon.

19. A method of manufacturing a semiconductor device according to claim 1, comprising the further step of patterning the second amorphous or polycrystalline silicon such that the patterned second amorphous or polycrystalline silicon covers the first amorphous or polycrystalline silicon.

20. A method of manufacturing a semiconductor device according to claim 1, wherein said first polycrystalline silicon and said second polycrystalline silicon are included in a memory cell of said semiconductor device.

21. A method of manufacturing a semiconductor device according to claim 7, wherein said first amorphous material and said second amorphous material have a same main component.

22. A method of manufacturing a semiconductor device according to claim 1, including the further step of forming a conductive material, different from silicon, so as to be on the first polycrystalline silicon and have the second amorphous silicon thereon, such that the second amorphous silicon is in contact with the first polycrystalline silicon via the conductive material.

23. A method of manufacturing a semiconductor device according to claim 22, wherein the conductive material is a metal.

24. A method of manufacturing a semiconductor device according to claim 22, wherein said conductive material is a material forming a silicide with silicon.

25. A method of manufacturing a semiconductor device according to claim 1, including the further step of forming a material, different from silicon, so as to be on the first polycrystalline silicon and have the second amorphous silicon thereon, such that the second amorphous silicon is in contact with the first polycrystalline silicon via said material.

26. A method of manufacturing a semiconductor device according to claim 7, including the further step of forming a material, different from the first and second amorphous materials, so that said material is on the first amorphous or polycrystalline material and has the second amorphous material thereon, such that the second amorphous material is in contact with the first amorphous material via the material different from the first and second amorphous materials.

27. A method of manufacturing a semiconductor device according to claim 26, wherein said material different from the first and second amorphous materials is another conductive material.

28. A method of manufacturing a semiconductor device according to claim 27, wherein said another conductive material is a metal.

29. A method of manufacturing a semiconductor device according to claim 27, wherein said another conductive material is a material forming a silicide with silicon.

30. A method of manufacturing a semiconductor device according to claim 7, wherein said first amorphous material is formed overlying said conductive material.

31. A method of manufacturing a semiconductor device according to claim 13, wherein said first amorphous material is formed overlying said conductive material.

32. A method of manufacturing a semiconductor device according to claim 13, comprising the further step of forming a material different from said first and second amorphous materials, for forming a third layer, so that the third layer is on the first amorphous material and has the second amorphous material thereon.

33. A method of manufacturing a semiconductor device according to claim 32, wherein said material different from the first and second amorphous materials is another conductive material.

34. A method of manufacturing a semiconductor device according to claim 33, wherein said another conductive material is a metal.

35. A method of manufacturing a semiconductor device according to claim 33, wherein said another conductive material is a material forming a silicide with silicon.

* * * * *